(12) United States Patent
Tanaka

(10) Patent No.: US 6,430,204 B1
(45) Date of Patent: Aug. 6, 2002

(54) SEMICONDUCTOR LASER DEVICE AND OPTICAL PROCESSING SYSTEM USING THE DEVICE

(75) Inventor: Toshiaki Tanaka, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/376,292

(22) Filed: Aug. 18, 1999

(30) Foreign Application Priority Data

Aug. 19, 1998 (JP) .......................................... 10-232556

(51) Int. Cl.$^7$ .............................................. H01S 5/227
(52) U.S. Cl. ......................................................... 372/46
(58) Field of Search ..................................... 372/45, 46

(56) References Cited

U.S. PATENT DOCUMENTS 4,821,277 A * 4/1989 Alphonse et al. ............. 372/46
5,235,609 A * 8/1993 Uchida et al. ................ 372/46

* cited by examiner

Primary Examiner—James W. Davie
(74) Attorney, Agent, or Firm—Antonelli, Terry, Stout & Kraus, LLP

(57) ABSTRACT

The semiconductor laser device has a stripe optical waveguide formed in its resonator structure. The stripe optical structure has right and left sides, which are different in shape from each other in its cross sectional view at a plane vertical to the substrate and parallel to the facets of the resonator structure. In addition, at least one of the right and left sides has concave and convex portions in the longitudinal direction in the top view thereof.

The laser device can thus obtain high output characteristics stably without losing the fundamental characteristics, thereby solving the problems related to the instability of the laser light in the fundamental traverse-mode and obtaining an excellent linearity to correspond to a pulse current. Consequently, the semiconductor laser device is applicable as a light source for a highly practical optical information processing system having a fast responsibility to the pulse current waveform from the driving power supply of an optical disk drive unit.

36 Claims, 17 Drawing Sheets

SEMICONDUCTOR LASER DEVICE AND OPTICAL PROCESSING SYSTEM USING THE DEVICE

BACKGROUND OF THE INVENTION

The present invention relates to a semiconductor laser device, more particularly to a semiconductor laser device applicable for an optical information processing system, as well as an optical information processing system that uses the same.

A semiconductor laser device having a conventional Fabry-Perot type resonator structure has a larger optical power density around the facets than inside the resonator, thereby the generated heat energy causes a phenomenon of catastrophic optical damage to occur and melt the semiconductor material of the laser device. This comes to limit the upper limit value of the optical output of the laser device. In order to prevent such a phenomenon, a method has been taken; the large bandgap energy assumed at the facets of the resonator is increased, thereby forming a window structure transparent to the laser light there. A high output semiconductor laser provided with such a window structure and a method for forming the same are disclosed in the related art technical document 1: IEEE Journal of Quantum Electronics 1993, vol.29, No.6, pp.1874–1879. In the case of the semiconductor laser described in the related art technical document 1, the bandgap energy of the active layer is set largely around the facets of the resonator, thereby suppressing effectively the optical absorption around the facets and avoiding the above mentioned phenomenon of catastrophic damage even at a high optical output time (that is, when a high current is injected into the active layer). However, the semiconductor laser described in the related art technical document 1 has been confronted with problems that the laser oscillation becomes unstable in the fundamental traverse-mode when a high current is injected into the active layer, so that a kink occurs in the optical output-current characteristics and the laser light cannot follow up the waveform of the fast pulse current from a driving power supply, thereby saturating the optical output and degrading the linearity of the efficiency. Consequently, the semiconductor laser described in the related art technical document 1 has been impossible to correspond fast and linearly to the injected current waveform up to a high optical output value. The related art technical document 1 describes no idea for solving such problems.

Techniques related to the stripe optical waveguide structure for semiconductor laser devices are disclosed, for example, in the related art technical document 2: Japanese Patent Laid-Open No. Hei 5-291681 and the related art technical document 4: Japanese Patent Laid-Open No. Hei 10-154843. In the related art technical document 2, a structure with modulated stripe width is described as a structure for easier starting of self-sustained pulsating. The document 2 also describes the range for setting such a waveguide structure and the design contents. The related art technical document 3 describes how an optical waveguide structure with a modulated stripe width is employed for reducing the series resistance of the laser device, thereby suppressing heat generation. The document 3 also describes how to improve the reliability of the laser device using such an optical waveguide structure with a modulated stripe width, as well as the wavelength selectivity effective to control the longitudinal mode. However, those documents 2 and 3 do not describe anything about a method for obtaining an optical high output from the laser device and the stability of the optical output itself nor anything about the influences of the stripe structure be exerted on the fundamental traverse-mode nor anything about the guidelines of the structure for suppressing higher order modes.

On the other hand, the document 4 describes how to control the fundamental traverse-mode with respect to an optical waveguide structure with a periodically modulated stripe width, as well as the designing guidelines for such a structure. In other words, the document 4 describes a method for narrowing periodically the width of a stripe optical waveguide to be extended along the resonator, thereby making the shape of structure symmetric to the center line extended along the resonator of the stripe optical waveguide so as to secure the stability of the fundamental traverse-mode.

SUMMARY OF THE INVENTION

In the case of the conventional laser device as described in the related art technical document 1, the stripe structure employs the stripe optical waveguide whose width is fixed in the direction along the resonator and is formed in linear shape. Even in the fundamental traverse-mode, when a high current is injected in the active layer, a kink phenomenon occurs in the optical output-current characteristics due to the unstable fundamental traverse-mode. And furthermore, this makes it impossible for the laser light to follow up linearly with the driving current when data is written in memories of an optical disk and cause the memories to be deformed and the error rate to be increased in reading.

Factors causing the traverse-mode to become unstable include a hole burning phenomenon, a beam steering phenomenon, etc. The hole burning phenomenon is a phenomenon that reduces the built-in refractive index difference to the lateral direction of an active layer due to a refractive index change to occur when carriers are injected. The beam steering phenomenon is a kind of the beam instability phenomena. The phenomenon means changes of the irradiation direction and the optical output due to an interference to be caused by the coupling of the fundamental mode with the higher order (first order) mode while the laser light resonates by making a round strip in the resonator when the propagation coefficient is changed by the density of carriers, gain profile, and operation temperature in the optical waveguide.

Hereunder, description will be made for the hole burning phenomenon with reference to a semiconductor laser device provided with a stripe laser optical waveguide structure. The hole burning phenomenon is the main factor for causing the above mentioned unstable traverse mode. While a laser light is oscillated with injected carriers (a driving current) in the stripe optical waveguide structure of a semiconductor laser device, if the injected amount of carriers is increased so as to raise the optical output, the following problem arises; when high carriers are injected, the laser light intensity is increased locally in the center of the stripe optical waveguide, thus the stimulated emission of the laser light at this site is increased remarkably. Consequently, the injected carriers are much consumed due to the recombination of injected carriers, causing the center of the distributed carriers in the stripe optical waveguide to become thin just like a hole. Such a profile of carriers affects directly the refractive index profile in the emission active layer, and further the propagation of the laser light in the active layer. Such the injected carriers then cause a minus change in the refractive index difference, forming a hole-like recess in part of the refractive index profile of the emission active layer (a high refractive index area usually generated like an almost rectangular shape according to the stripe ridge) built in by an optical waveguide, etc.

In order to solve the above conventional problems of the hole burning phenomenon, measures have been taken up to now so that the refractive index difference is increased in the lateral direction of the active layer and a narrower stripe waveguide is designed, as well as a quantum well structure is employed for the active layer, thereby suppressing the reduction of the refractive index when carriers are injected.

However, these related art techniques have not been effective for solving the latter problem with the beam steering phenomenon. Hereunder, this phenomenon will be described with reference to a semiconductor laser device provided with a stripe laser optical waveguide structure.

In order to solve the beam steering phenomenon, in consideration of propagation coefficients of both fundamental mode and first-order mode, a resonator length is set so as to avoid an interference caused by the coupling of the fundamental traverse-mode with the high order mode. The method, however, has not been effective enough because of the changes of the above conditions in the optical waveguide. For a laser device manufactured with the conventional techniques, the traverse-mode goes unstable especially when the laser device is driven with a pulse current. The fundamental traverse-mode is often coupled with the first-order mode at a lower injection current, thus it is difficult to write and read data in/from memories with high reliability and respond with excellent linearity to the pulse current signal from an optical disk drive unit.

Under such the circumstances, it is a most important object of the present invention to provide a semiconductor laser device, which can suppress the hole burning phenomenon causing the fundamental traverse-mode to become unstable as described above, as well as suppress the above beam steering phenomenon, thereby obtaining excellent linear responsibility to optical outputs up to a high level, which has not been achieved by any of normal stripe structures. And furthermore, it is another object of the present invention to correct the conventional instability of the fundamental traverse-mode, which has been a problem, as well as the non-linearity of the optical output-current characteristics, thereby stabilizing the high output operation of the laser device when driven with a fast pulse current, which has not been solved completely with any of the conventional structures.

The present invention provides a semiconductor laser device, which employs a new stripe structure not realized by any of the conventional techniques, enabling high output stable operations without losing almost no fundamental characteristics and assuring the stability of the fundamental traverse-mode, which often becomes unstable when in fast driving, until a high current injection. With such the optical output-current characteristics of the laser device can correspond linearly to high outputs required for optical recording of information, which is a specification of the system apparatus. In addition, the laser device can follow up with the current pulse waveform generated from a driving power supply. It is also another object of the present invention to provide an optical information processing system employing this laser device as a light source, which is able to be driven with a fast pulse waveform and correspond to high density optical recording memories.

In order to achieve the above objects, the present invention also discloses a method for providing a semiconductor laser device that satisfies all the specifications of the characteristics required for information processing systems by inventing a new stripe structure for semiconductor laser devices so as to provide a semiconductor laser light source, which can follow up accurately with the current signal from such an optical information processing system as an optical disk drive unit, etc., as well as an optical information processing system that uses such a semiconductor laser device.

In order to achieve the above object and effect, the present invention also discloses that the newly invented stripe structure described above is characterized firstly by an optical waveguide structure provided with a modulated stripe width and inclined to the facets of the laser device, and secondly another optical waveguide structure provided with a modulated stripe width and asymmetric right and left sides in the top or cross sectional view. Consequently, the laser device and the drive unit can have the optical output-current characteristics with an excellent linearity and a fast linear responsibility even for a fast pulse current from a driving power supply of the object system.

Hereunder, the coupling of the fundamental traverse-mode with the first-order mode will be described in order to disclose the preventive measures taken in this method. If the propagation coefficients of the fundamental traverse-mode and the first-order mode are $\beta0$ and $\beta1$, the fundamental mode and the first-order mode interfere with each other when the relational expression of $\Delta\beta=n\pi/L$ is satisfied. The $\Delta\beta$ means $\Delta\beta=\beta0-\beta1$ and L is a resonator length, and n is an integer. The above relational expression indicates a condition for the mutual interference to occur between the fundamental mode and the first-order mode, that is, a condition to cause a coupling of those two modes when the phase difference between the two traverse modes is an integer multiple of $\pi$ while the laser light resonates by making a round trip in the resonator. At this time, the laser light intensity profile in the laser device becomes a winding light beam profile in the stripe area, which is none other than the beam steering phenomenon. Therefore, when the laser light goes away from the facets of the resonator, the beam is irradiated in the tangential direction of the winding light beam, thereby the radiation direction of the beam is changed from the direction vertical to the facets of the resonator. In addition, the radiated laser light output is reduced significantly. The above propagation coefficients are much controlled by various factors which affect the traverse mode, such as density of carriers, gain profile in the stripe waveguide, operation temperature conditions and injected current volume, etc. Therefore, just fixing the $\Delta\beta$ of the above-mentioned relational expression and setting the resonator length so as to omit the above conditions will not be enough.

In this method, therefore, in order to avoid the increase of the gain in the first-order mode, the stripe optical waveguide is provided basically with the stripe structure increasing both optical loss inside the optical waveguide and gain difference between the first-order mode and the fundamental mode, as well as with the stripe structure being asymmetric in the right and left sides along the resonator, thereby increasing the optical loss inside the optical waveguide in the first-order mode and preventing the laser light from being closed at an integer multiple of the $\pi$ during resonating by making a round trip in the resonator so as to change the resonating condition.

More concretely, the conventional linear shape is not employed for composing the resonator of the stripe structure, but a non-linear shape is employed for composing the resonator oh the stripe structure. Then, in the top or cross sectional view, the optical waveguide is provided with the structure whose stripe shape of the right and left sides is asymmetric. Concretely, the stripe structure is formed with a periodically modulated width at both sides or one side of the stripe structure along the resonator. If the width by both sides is modulated periodically in such stripe structure, it should be avoided to compose the stripe structure with symmetric stripe shape of the right and left sides in the top or cross sectional view. Such the stripe optical waveguide can be composed firstly by inclining the center line of the stripe structure at an angle θ to the direction vertical to the facets of the resonator, and secondly by using a misoriented substrate so as to be provided with asymmetric stripe shape of the right and left sides in the cross sectional view of the stripe structure, although it is provided with symmetric stripe shape in the top view. Thus, the stripe optical waveguide is set so as to be provided substantially with asymmetric stripe shape of the right and left sides. The angle θ can be taken as an angle at which the laser light propagated through the stripe optical waveguide is applied obliquely to the facets of the resonator. The conditions are also set within a range of 0° to 0.5° including 0° for propagating stably the laser light in the fundamental traverse-mode. More preferably, the conditions should be set a range from 0° to 0.4° including 0°, and furthermore preferably a range from 0.1° to 0.3°. In this method, the stripe optical waveguide which is inclined is composed so that the laser light is propagated with this angle θ to the facets of the resonator.

According to this method, therefore, a misoriented structure is employed as the crystal substrate for forming the semiconductor laser device. In this case, when the ridge-shaped stripe is formed in an etching process, the stripe shape becomes asymmetric in the right and left sides as shown in FIG. 4. Although the stripe optical waveguide is periodically modulated in width and composed symmetrically in its top view shown in FIG. 5, the optical waveguide becomes asymmetric in the right and left sides in its cross sectional view as shown in FIG. 4. For example, as shown in FIG. 13, a ridge-shaped structure is formed for both of the layers 17 and 18 respectively, so that the left side of the ridge-shaped stripe is inclined sharply, and the right side of it is inclined gently. The stripe structure with a periodically modulated width as shown in FIG. 14 is given only to this right side area. Consequently, the optical waveguide can also be composed asymmetrically. When the misoriented substrate is employed, the optical stripe waveguide can be composed asymmetrically, so that the above single θ is not given to the facets of the resonator. For the asymmetric ridge-shaped stripe optical waveguide as shown in FIG. 13, the angle of inclination is small in the right side area and a gradual change of the refractive index difference is built in there. The stripe optical waveguide with a periodically modulated width shown in FIG. 4 can thus be designed so as to set a large optical loss in the optical waveguide effectively in the first-order mode.

According to the laser device of the present invention, therefore, the resonance of the propagated laser light in the coupling of the fundamental traverse-mode and the first order mode can be prevented. Hereunder, this effect will be described with reference to FIGS. 26A and 26B, as well as FIGS. 27A and 27B, which are all top views of the stripe structure. In the case of the conventional linear stripe structure shown in FIG. 26A and the stripe structure with a periodically modulated width as shown in FIG. 26B, the propagated laser light in the coupling of the fundamental traverse-mode with the first-order mode has to satisfy the matched condition of resonating by making a round trip in the resonator, so the laser light resonates. Under such the condition, therefore, the beam steering phenomenon occurs and this causes the output of the irradiated beam to be varied. And accordingly, a non-linear kink response appears in the optical output-current characteristics. In such a case, the conventional laser device cannot satisfy the requirement of the drive unit for the application system . Therefore, any of the conventional structure laser devices cannot cope with this problem. On the other hand, in the case of the optical waveguide structure of the present invention, which is provided with a waveguide structure inclined to the facets with a modulated stripe width as shown in FIG. 27A and an optical waveguide structure with a modulated width at only one side shown in FIG. 27B, the optical waveguide comes to have non-periodical or asymmetric sides. The propagated laser light, if the fundamental traverse-mode and the first-order mode are coupled, cannot satisfy the matched condition due to the fluctuation of phase during resonating by making a round trip of the laser light in the resonator. As shown in FIGS. 27A and 27B, even after resonating by making a round trip in the resonator, the propagated laser light cannot resonate, thus the beam steering phenomenon does not occur nor the non-linear kink does not appear in the optical output-current characteristics.

Each of those methods of the present invention has controlled stably the fundamental traverse-mode and successfully reduced occurrence of the coupling of the fundamental traverse-mode with the first-order mode significantly, because the first-order mode has the large optical loss in the optical waveguide so as to be under the cut-off condition when a high current is applied from a drive unit (a driving power supply, etc.). Thus, the technique of the laser device of the present invention can solve the above problems related to the instability of the fundamental traverse-mode when driven with a pulse current, as well as the problems related to the inability of excellent linear optical output responsibility, thereby provides a semiconductor laser device that satisfies all the requirements of optical disk systems, as well as provides a drive unit and an optical information processing system that use this semiconductor laser device as a light source respectively.

In order to achieve the above objects, first of all, the semiconductor laser device of the present invention is provided with a resonator structure for generating a laser light formed on a substrate, and a stripe optical waveguide (for controlling the traverse mode of the laser light) is provided in the resonator structure. The stripe optical waveguide is basically characterized by that the right and left sides are different in shape from each other in the cross sectional view cut at a plane vertical to the substrate surface and parallel to the facets of the resonator structure. In addition, at least one of the right and left sides has concave and convex portions in the longitudinal direction of the stripe optical waveguide in the top view thereof.

Furthermore, another laser device of the present invention is provided with a resonator structure for generating a laser light, and a stripe optical waveguide is provided in the resonator structure. The stripe optical waveguide is composed so as to have a modulated width, which is increased and reduced at least twice between the facets of the resonator structure. In addition, the center axis of the stripe waveguide in the longitudinal direction is inclined to the facets of the resonator structure at an angle of θ to an imaginary line vertical to the facets at the shortest distance, but within $0° < θ \leq 0.5°$.

And furthermore, the optical information processing system of the present invention includes a light source having a resonator structure for generating a laser light formed on a substrate, an information recording medium, an optical system for applying the laser light on the information recording medium, a driving power supply for supplying a current to the light source, and a control unit for controlling the driving power supply. The light source has a stripe optical waveguide in its resonator structure. The stripe optical waveguide is basically characterized by that the right and left sides are different in shape from each other in the cross sectional view cut at a plane vertical to the substrate face and parallel to the facets of the resonator structure. In addition, concave and convex portions are formed at least at one of the right and left sides in the longitudinal direction of the stripe optical waveguide in the top view thereof.

In addition, another optical information processing system of the present invention includes a light source having a resonator structure for generating a laser light formed on a substrate, an information recording medium, an optical system for applying the laser light on the information recording medium, a driving power supply for supplying a current to the light source, and a control unit for controlling the driving power supply. The light source has a stripe optical waveguide in its resonator structure. The stripe optical waveguide is composed so as to have a modulated width, which is increased and reduced at least twice between the facets of the resonator structure. In addition, the center axis of the stripe optical waveguide in the longitudinal direction is inclined to the facets of the resonator structure at an angle of θ to an imaginary line vertical to the facets at the shortest distance, but within $0°<\theta\leq0.5°$.

With such a configuration, it is prevented that the fundamental traverse-mode of the laser light is coupled with a high-order mode, thereby an excellent linear optical output responsibility is assured for a current injection within a range up to the driving optical output. It is also prevented that the optical output is saturated and non-linear responses are generated for the height and width of a current signal even when driven with a modulated pulse current, thereby a fast linear responsibility is obtained for the system.

In order to improve the effect of the basic configuration of the optical information processing system as described above, the present invention proposes the following four types of configurations.

In the first configuration, the stripe optical waveguide is set so as not to couple the fundamental traverse-mode of the laser light with its high order mode.

In the second configuration, the stripe optical waveguide has concave and convex portions at both the right and left sides in the longitudinal direction thereof, and the concave and convex portions at both the right and left sides are different in shape from each other between the right side and the left side. For example, the distance difference between the concave and the convex portions in the modulated stripe width, which are provided at one of those right and left sides, is set larger than that of the other.

In the third configuration, concave and convex portions, which are the same in shape, are provided on both right and left sides of the stripe optical waveguide in the longitudinal direction.

In the fourth configuration, one side of the stripe waveguide is formed linearly in the longitudinal direction.

For a further preferred configuration, the angle θ should be set within $0°<\theta\leq0.4°$. If the angle θ is set within $0.1°\leq\theta0.3°$, the above effect will further be improved. If the stripe waveguide is inclined so that the laser light is entered to the facets of the resonator at such a set angle θ, it is possible to obtain the expected driving optical output with an excellent linear responsibility even to a high injected current up to the driving optical output in the fundamental traverse-mode for the laser light generated by amplifying through the stripe optical waveguide structure.

On the other hand, the semiconductor laser light also includes a substrate consisting of semiconductor crystal, an emission active layer formed on the substrate, and optical waveguide layers provided on the upper and the lower surface of the emission active layer respectively. On the optical waveguide layer provided on the upper surface of the emission active layer is formed a ridge-shaped stripe structure which is extended along the longitudinal direction of the resonator structure of the laser device by processing the optical waveguide layer provided on the upper surface of the emission active layer. The present invention also recommends that the width of the stripe structure is set so as to have an effective refractive index difference in the direction in which the emission active layer crosses the longitudinal direction of the resonator structure so as to stabilize the propagation of the laser light in the emission active layer in the fundamental traverse-mode.

When the width of the stripe structure is modulated periodically or non-periodically, the laser light can correspond to high injected currents up to the driving optical output with an excellent linearity and generates a driving optical output in the fundamental traverse-mode, in which the laser light is propagated in the stripe structure and is generated by amplifying when a current is injected continuously or a pulse current is injected from the driving power supply mounted in the object system.

In this configuration, it is also possible to form the semiconductor crystal at both sides of the ridge-shaped stripe structure so as to embed the stripe structure respectively. In this case, the semiconductor crystal is given a larger bandgap energy than the bandgap energy of the emission active layer or the energy of the laser light which corresponds to the oscillation wavelength from the emission active layer. With this, an optical waveguide structure is formed in the stripe area, thereby the laser light propagation in the fundamental traverse-mode can be stabilized due to the effective refractive index difference set in the lateral direction of the active layer. Consequently, the laser light can correspond to a high injected current with an excellent linearity and generates a driving optical output in the fundamental traverse-mode, in which the laser light is propagated in the stripe structure and is generated by amplifying when a current is injected continuously or a pulse current is injected from the driving power supply mounted in the object optical information processing system.

In addition, the semiconductor crystal, which embeds both sides of the ridge-shaped stripe structure, may be composed so that its one side width are modulated periodically or both side widths are modulated non-periodically so as to compose the object optical waveguide in which the optical propagation inner loss and the refractive index difference both along the resonator in the active layer are not changed linearly nor in uniform, In other words, when both optical propagation inner loss and refractive index difference in the optical waveguide are modulated periodically or set non-periodically towards the resonator in the emission active layer, it becomes possible to stably control the fundamental traverse-mode of the laser light propagated in the optical waveguide corresponding to the refractive index difference, as well as enable fast linear correspondence to the height and width of the current signal even when driven with a modulated pulse current without saturating the optical output nor generating non-linear responses. In addition, the stripe structure for controlling the fundamental traverse-mode stably should be formed so as to propagate the laser light corresponding to the refractive index difference to be set in the lateral direction of the active layer. Then, the ridge-shaped stripe structure should be formed so that the refractive index difference mainly depends on the difference in the real part of the refractive index.

Hereunder, other examples for the semiconductor laser device of the present invention will be described one by one.

Firstly, the semiconductor laser device used here employs a crystal substrate misoriented within a range of 0 to 54.7° (111) orientation from (100) orientation, on which the optical waveguide layer and the emission active layer are to be formed. Thus, the semiconductor laser device whose ridge-shaped stripe optical waveguide construction is formed on the misoriented crystal substrate. More preferably, the substrate orientation should be misoriented within a range of 5 to 16° as the crystal orientation. In the case of such a semiconductor laser device, the ridge-shaped stripe structure formed on the misoriented crystal substrate should be etched, thereby the object optical waveguide structure with asymmetric stripe shape of the right and left sides should be formed, and the shape of the inclined sides forming the ridge-shaped stripe structure should be different from each other in the right and left sides. In addition, of the asymmetric stripe shape of the right and left sides which the ridge-shaped stripe structure of the above semiconductor laser device has, the width of the gently inclined ridge side, formed in the direction in which the crystal substrate is misoriented, should be modulated periodically or set non-periodically along the resonator. Because, the fundamental traverse-mode can be stabilized in the optical waveguide structure when the loss in the optical waveguide and the refractive index difference are modulated periodically or set non-periodically along the resonator.

Secondly, the semiconductor laser used here is provided with a ridge-shaped stripe structure having a resonator structure whose length is from 200 µm to 1000 µm and extended along the resonator. The length of the resonator is decided by the pitches of the facets, formed through cleaving, of the resonator of the laser device.

Thirdly, the semiconductor laser device used here is provided with a ridge-shaped waveguide structure, which employs a multiplexed quantum well structure as its emission active layer, more preferably, employs a strained multiplexed quantum well structure as the emission active layer. This strained multiplexed quantum well structure employs lattice distortion.

Details of each of the semiconductor laser devices of the present invention and the optical information processing system that uses such a semiconductor laser device will be described below in the preferred embodiments of the present invention.

These and other objects and many of the attendant advantages of the present invention will be readily appreciated as the same becomes better understood by reference to the following detailed description when considered in connection with the accompanying drawings.

DESCRIPTION OF THE PREFERRED EMBODIMENTS

Hereunder, the preferred embodiments 1 to 12 of the present invention will be described in detail with reference to the accompanying drawings.

First Embodiment

The first embodiment of the present invention will be described with reference to FIGS. 1 through 8.

Figure 1:
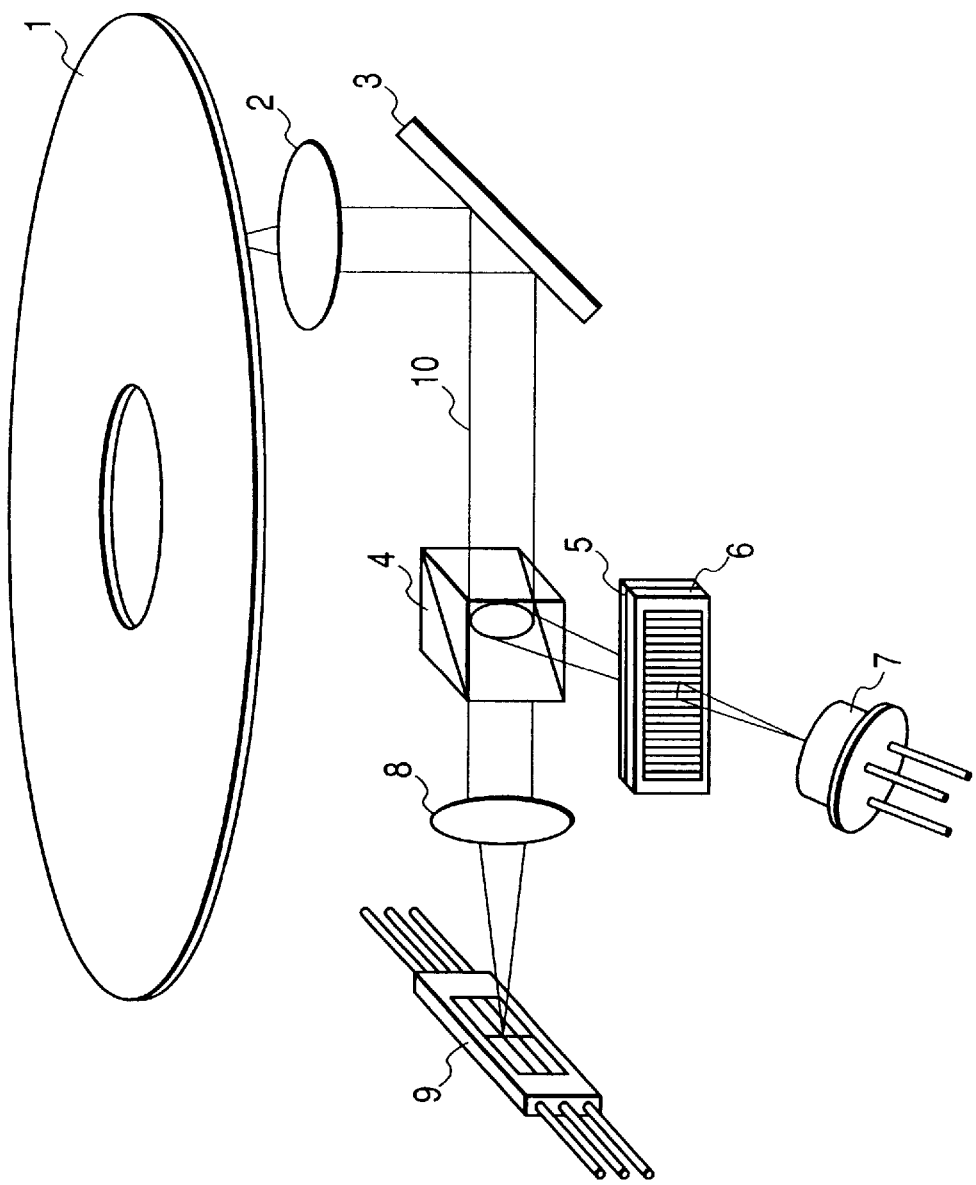
FIG. 1 is a sketch of an optical pick-up in which a semiconductor laser device of the present invention is mounted.

In this first embodiment, it is an object of the present invention to provide a semiconductor laser device 7, which can compose an optical pick-up of a system as shown in FIG. 1 and applicable as a light source for such an optical disk system as a digital video disk (DVD) ROM and RAM, as well as an optical magnetic disk, etc. and correspond fast to the driving current signal waveform from a drive unit with an excellent linearity. It is another object of the present invention to provide an optical information processing system provided with an optical pick-up as shown in FIG. 1 (sketch) using the semiconductor laser device 7 having the characteristics for satisfying the requirements of the optical disk systems.

Figure 2:
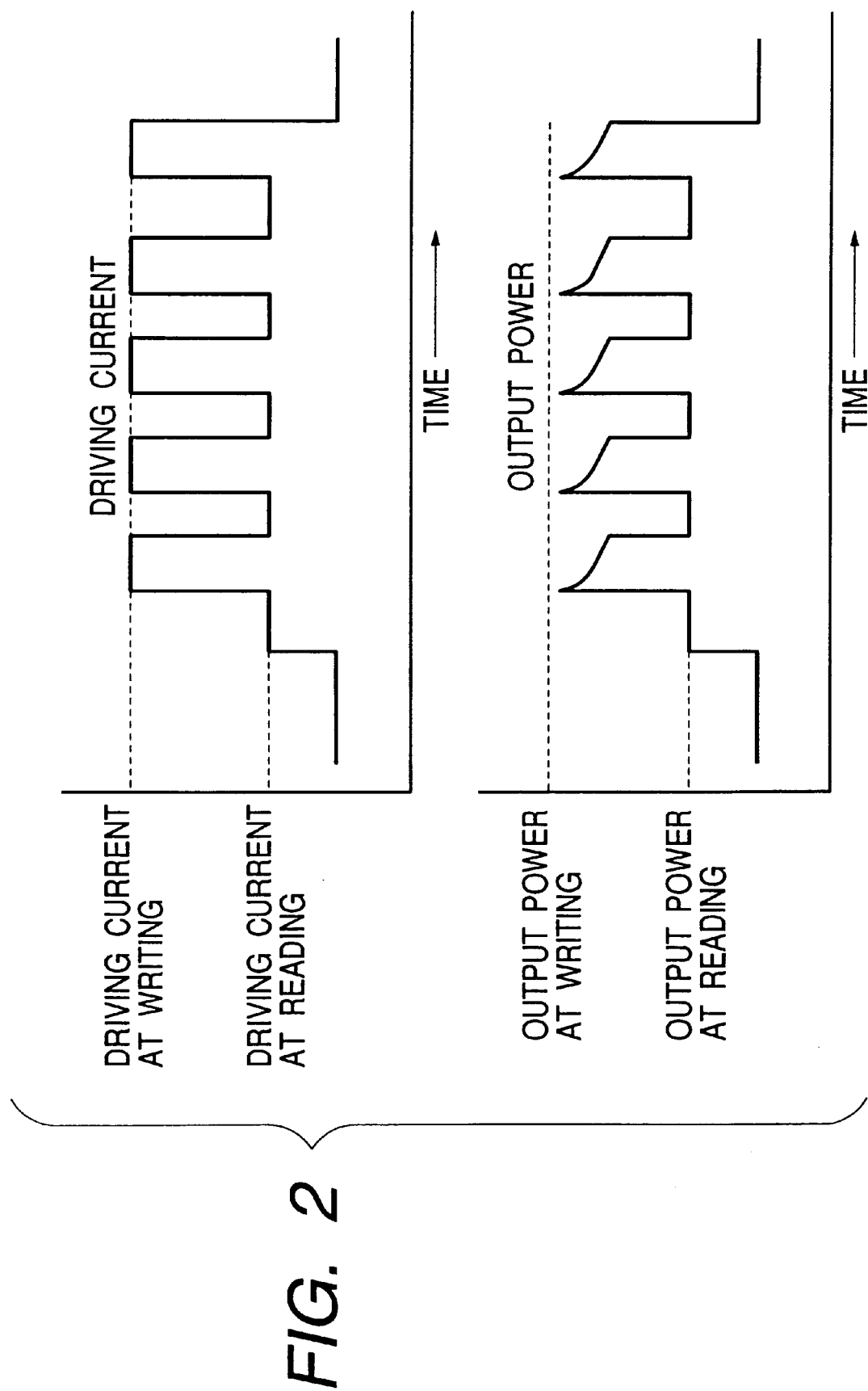
FIG. 2 illustrates an optical output power response to a driving current pulse waveform of a semiconductor laser device manufactured by the conventional technique used as a light source.
Figure 3:
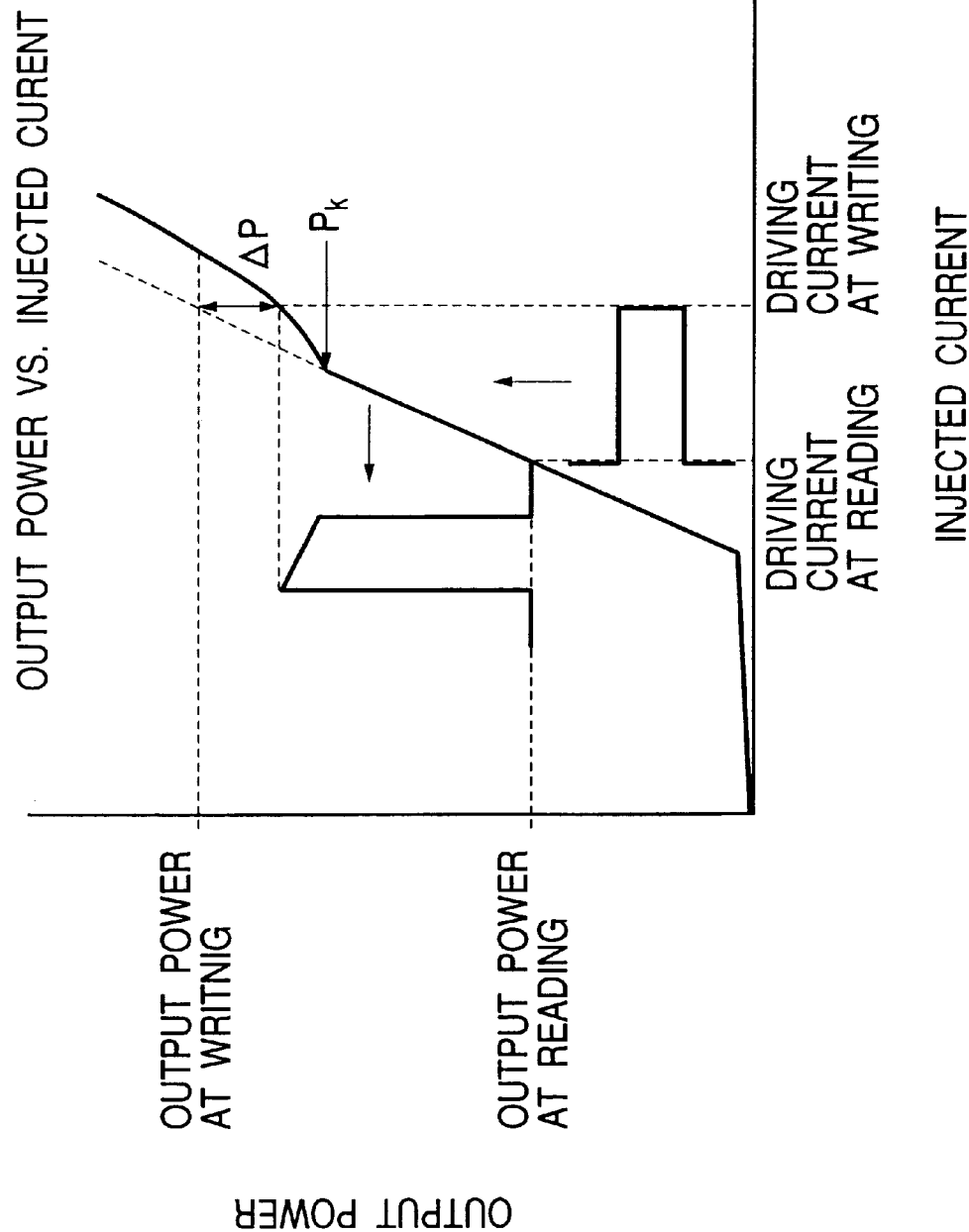
FIG. 3 illustrates the optical output-current characteristics of the semiconductor laser device manufactured by the conventional technique and an optical output power response to a driving pulse current therefrom.

Each of the conventional semiconductor laser devices have been confronted with a problem that the output power waveform of the laser device cannot follow up with the pulse current waveforms as shown in FIG. 2 if the laser device is driven with a current from a drive unit for writing in memories. Therefore, the optical recording system of the optical disk cannot function. This is because a kink Pk occurs in the output power-current characteristics of the laser device around the output power for writing, thereby an output power difference $\Delta P$ is generated as shown in FIG. 3 between the kink-occurred output power for writing and another optical output for writing, which is needed originally. In the case of the optical output waveform of the laser device, the height is just $\Delta P$ lower than the output power level for writing and the pulse current time responsibility is also low. Therefore, the optical output level is degraded gradually as shown in FIG. 2. In the case of the conventional laser device, the laser device has a linear stripe structure towards the resonator, so the high first-order mode is coupled with the fundamental traverse-mode when a high current is injected in the waveguide, thereby the optical output is varied and reduced. When in a fast pulse current time response, the fundamental traverse-mode goes unstable, causing the optical output to be reduced due to the influence of the temperature change and gain profile in the traverse mode. Those factors make it disable the conventional laser device to cope with the optical output level for writing in memories.

Figure 4:
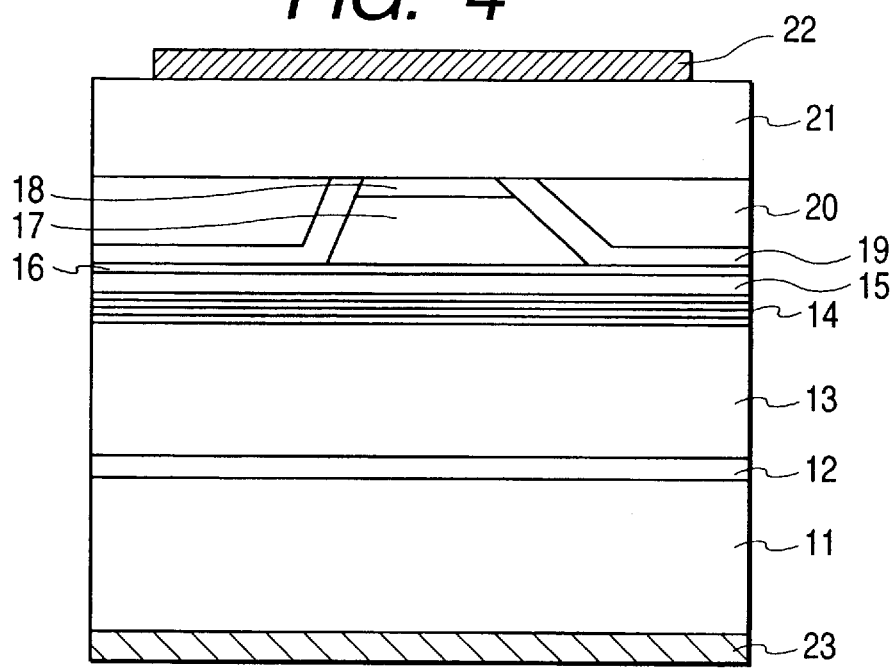
FIG. 4 is a cross sectional view of the structure of the laser device indicating the first embodiment of the present invention.
Figure 5:
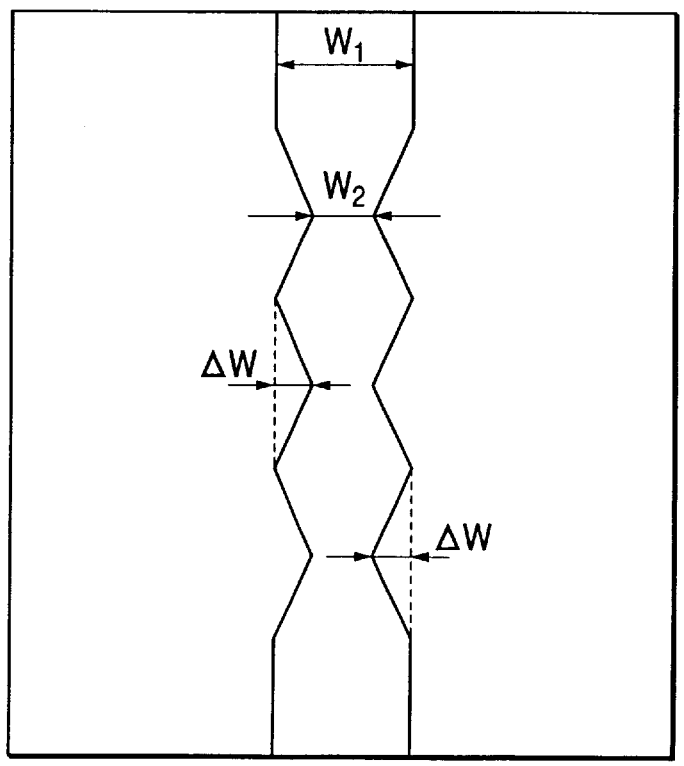
FIG. 5 is a top view of a stripe structure of the laser device in an embodiment of the present invention.

Next, description will be made for a configuration of another semiconductor laser device provided with a non-linear and asymmetric stripe structure of the present invention with reference to FIG. 4. The stripe structure can solve the above problems. In FIG. 4, on a n-type GaAs substrate with a misoriented structure 11, which is 10° misoriented to [011] orientation from (100) orientation, were epitaxial-grown an n-type GaAs buffer layer 12, an n-type AlGaInP optical waveguide layer 13, a strained multiplexed quantum well structure active layer 14 consisting of three compressed strained GaInP quantum well layers, four pulled strained AlGaInP quantum barrier layers, and unstrained AlGaInP light separate confinement layers at both sides, and a p-type GaInP optical waveguide layer 15, a p-type AlGaInP layer 16, a p-type AlGaInP optical waveguide layer 17, and a p-type GaInP layer 18 in order using the metalorganic vapor phase epitaxy method (MOVPE). After this, an insulating film mask was formed, then the layers 17 and 18 were removed in a photo-lithography process and in an etching process until the layer 16 appeared. As a result, a ridge stripe was formed as shown in FIG. 4. The top view of the ridge stripe was as shown in FIG. 5. However, inside the resonator was provided an area in which the stripe width was modulated periodically so that the number of cycles for such a periodical modulation became 3. Generally, the number of such cycles was set according to the number of beating loops of the laser light in the coupling of the fundamental traverse-mode with the high-order mode, taking the oscillation wavelength of the laser light into account. As for the stripe widths W1 and W2 shown in FIG. 5, W1 was set from 4.0 $\mu$m to 6.0 $\mu$m and W2 was set from 3.0 $\mu$m to 5.0 um. At 2$\Delta$W=W1−W2, therefore, $\Delta$W was set from 0.1 $\mu$m to 1.5 um. Around the facets of the resonator, a strait stripe area was provided so as to stabilize the laser waveform propagated in the fundamental traverse-mode. Since a misoriented structure substrate was used in this embodiment, the right and left sides of the ridqe-shaped stripe structure consisting of the layers 17 and 18 became asymmetric in its cross sectional view. Consequently, even when the stripe optical waveguide structure was symmetric at its modulated width as shown in the top view in FIG. 5, it was formed asymmetrically in the right and left sides in the cross section view. Consequently, when the laser light propagated in the stripe optical waveguide and resonated by making a round trip in the resonator, the laser light came to be propagated in the stripe optical waveguide structure formed asymmetrically at the right and left sides. Therefore, the beam steering phenomenon was prevented by avoiding the conditions indicated as a relational expression for the difference between the propagation coefficients and the length of the resonator. The above conditions cause the coupling and the mutual interference of the fundamental traverse-mode and the first-order mode. In this embodiment, the stripe structure employed as described above enabled the fundamental traverse-mode to be controlled stably and optical output-current characteristics to be obtained with an excellent linearity even when the laser device was driven with a high current pulse.

Next, an n-type AlGaAs or AlGaInP or AlInP current blocking layer 19 and an n-type GaAs current blocking layer 20 were embedded and grown selectively using the MOVPE method. At this time, the layer 19 had to satisfy the conditions that its bandgap energy was larger than that of the emission active layer 14, and at least, the bandgap energy was larger than the energy of the laser light corresponding to the oscillation wavelength and no laser light was absorbed in the layer 19. In addition, the layer 19 had to satisfy the condition that, at least, its refraction index was smaller than that of the optical waveguide layer 17. If the layer 19 was used as an AlGaAs or AlGaInP layer, the Al composition of the AlGaAs or AlGaInP layer 19 had to be set larger than that of the AlGaInP layer for composing the layer 17, so that the refraction index of the layer 19 became smaller than that of the layer 17. Consequently, the ridge-shaped stripe structure became an index-guided structure and the internal optical loss was reduced due to the layer 19. It was also possible to compose the waveguide as a real part index-guided structure having a real part refractive index difference in the traverse direction of the active layer. This real part index-guided structure could narrow the stripe width for obtaining the fundamental traverse-mode more than the complex number index-guided structure when the embedding layer was composed only of an n-type GaAs current blocking layer 20. The fundamental traverse-mode could thus be stabilized more effectively.

The insulating film mask used to form the ridge-shaped stripe structure was removed by etching, then the ridge-shaped stripe structure was embedded with a p-type GaAs contact layer 21 using the MOVPE method. Finally, the p-side electrode 22 and the n-side electrode 23 were evaporated, then the laser device was cut out by cleaving and scribing, thereby obtaining the cross sectional shape of the element as shown in FIG. 4.

Figure 6:
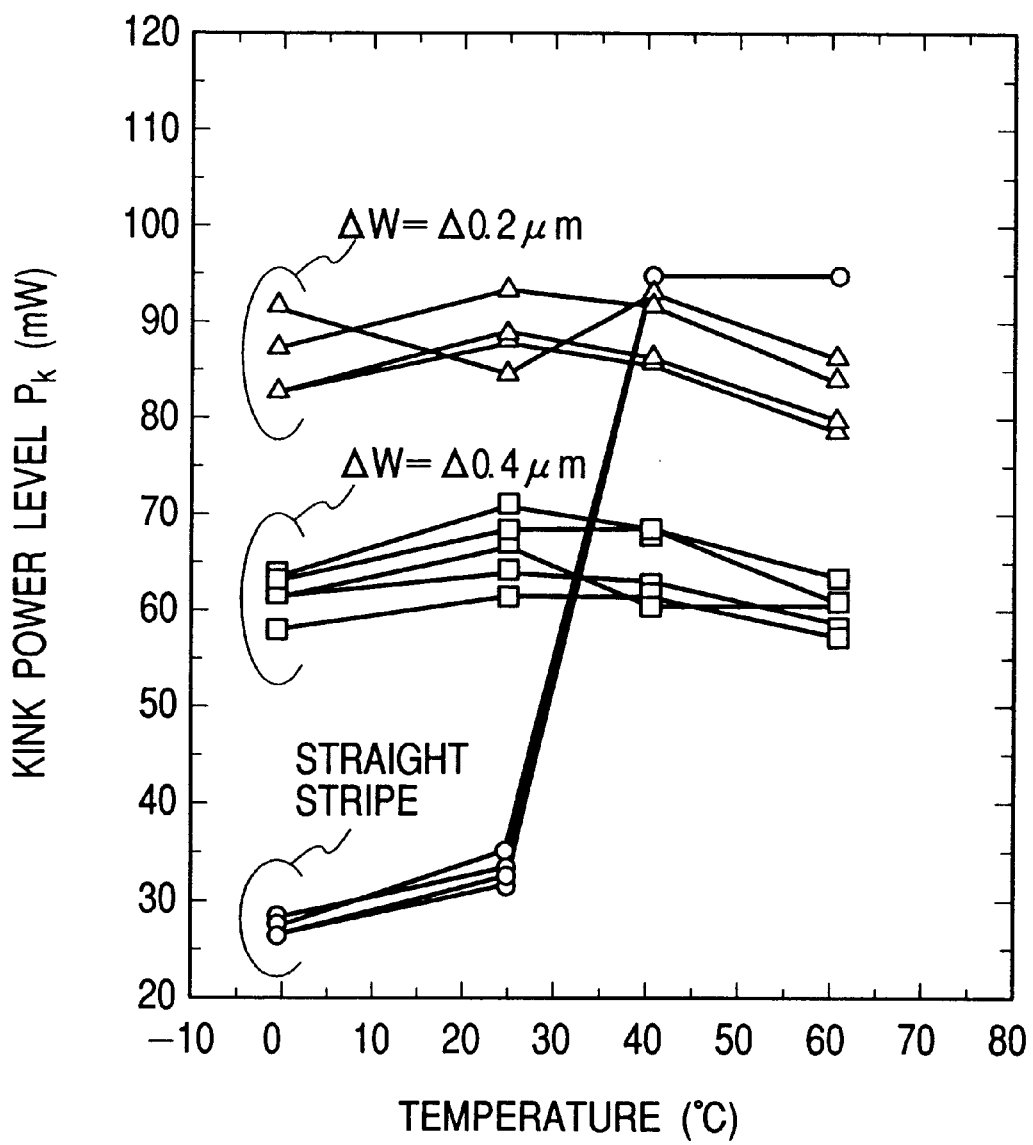
FIG. 6 is a graphical representation of the relationship between the link power level and the operation temperature of the semiconductor laser device of the present invention.

According to this embodiment, since a misoriented structure substrate was used, the ridge-shaped stripe structure could be composed with the asymmetric right and left sides in the cross sectional view. The semiconductor laser device could thus be provided with a real part index-guided structure embedded with a material having a lower refractive index and a larger bandgap energy than those of the ridge-shaped stripe structure. Consequently, the laser light was propagated stably in the fundamental traverse-mode even at a high current injection, thereby low threshold high efficient operations were enabled at a low optical loss. The laser device in this embodiment has thus proved that the kink optical output can be stabilized at a high level with respect to the temperature. As shown in FIG. 6, the conventional straight stripe structure obtained only a low kink optical output (not more than 400 mW) in a low temperature area (under the room temperature in FIG. 6). On the other hand, since the kink optical output at a high temperature became as high as twice, the fundamental traverse-mode became unstable. In the case of the conventional straight stripe structure, therefore, the kink optical output depended on the operation temperature significantly and since it was varied, it cannot be controlled properly. In the case of the laser device in this embodiment, however, since the waveguide was provided with a modulated width AW, the kink optical output was improved significantly. In addition, it was controlled stably even at the operation temperature. At ΔW=0.4 um, the kink optical output was set to 50 mW or over within the measured temperature range including the low (0°) temperature area. At ΔW=2.0 um, a kink optical output of 80 mW or over was assured. When the ΔW was optimized such way, the kink optical output was improved significantly, and it was controlled stably at the operation temperature.

Figure 7:
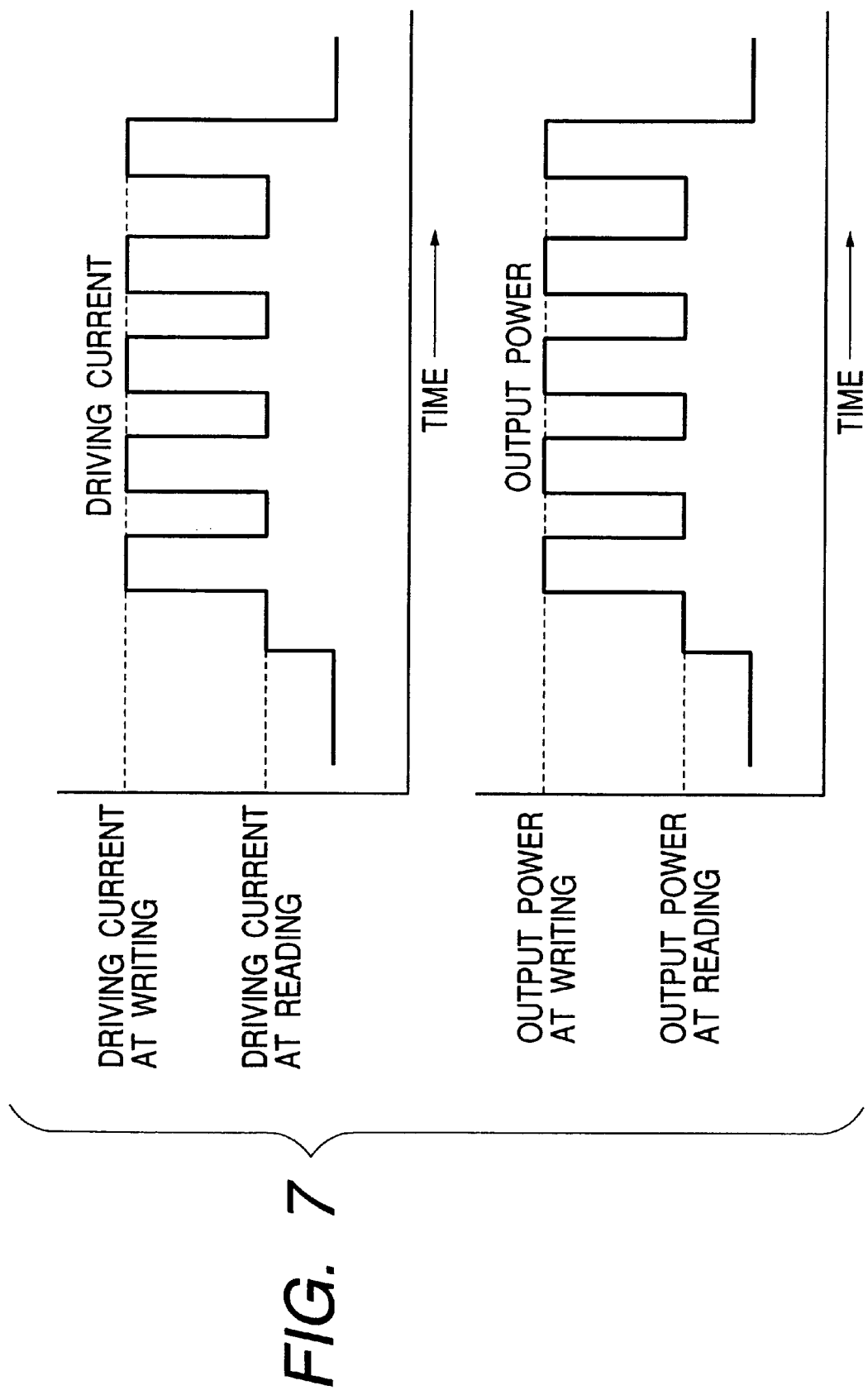
FIG. 7 shows an optical output power response to a driving current pulse waveform of a semiconductor laser device of the present invention used as a light source.
Figure 8:
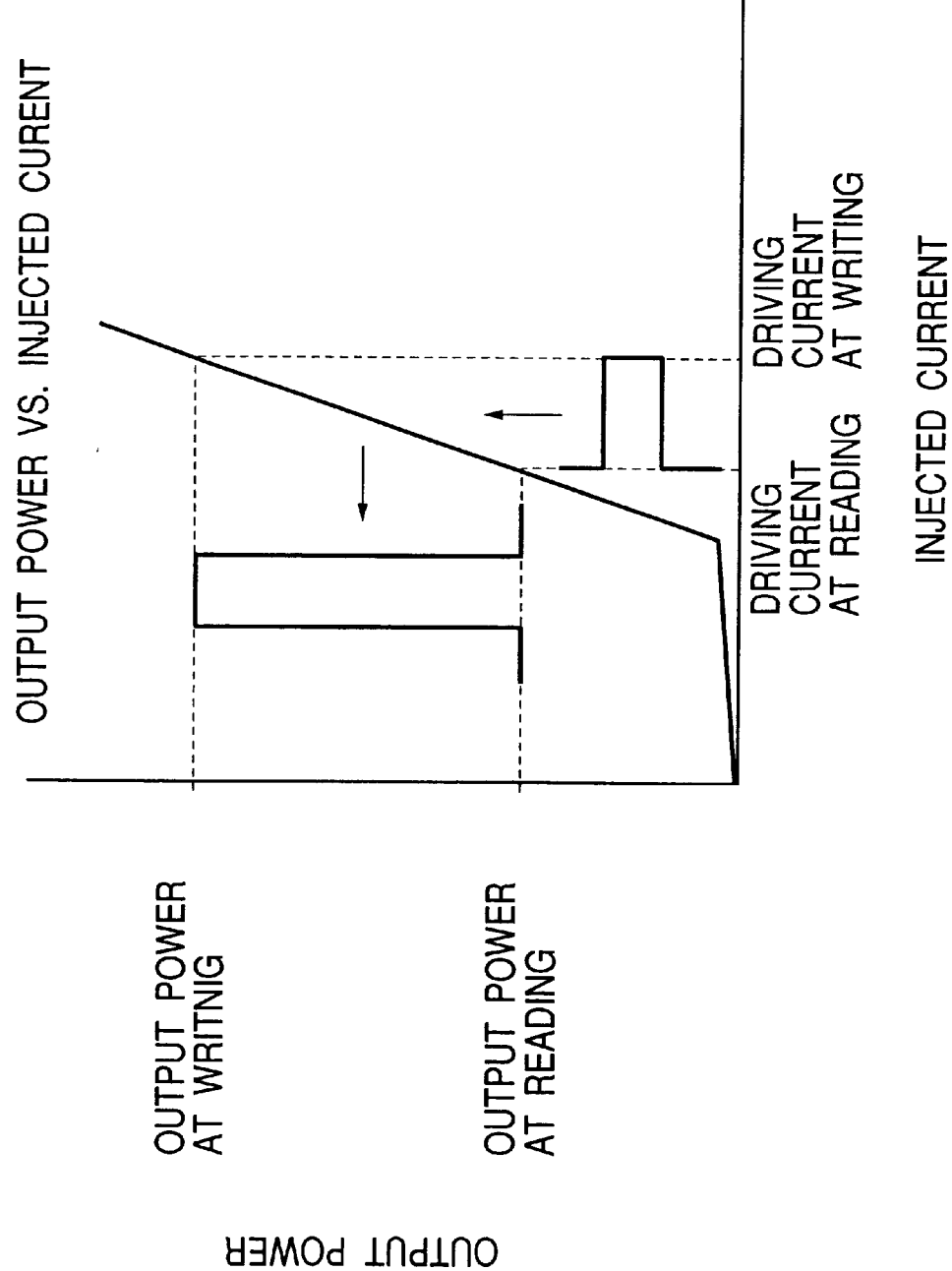
FIG. 8 shows the output power-current characteristics of a semiconductor laser device of the present invention and an optical output power response to a driving pulse current.

This laser device also followed up with the driving current from a drive unit as fast linear responses to the current waveforms as shown in FIG. 7. The optical output-current characteristics of this laser device had an excellent linearity corresponding up to a higher level than that of the optical output for writing in memories. Even at a fast pulse current injection, the injected current signal was protected from the degradation of both height and width. The linear responsibility of the optical output was also excellent as shown in FIG. 8. Although the stripe structure was provided with three periodical stripe width modulation areas towards the resonator in this embodiment, the same level characteristics was obtained for the laser device with the modulation areas set from three to five. The stripe structures were connected by a tapered line among the modulation areas of the stripe width, but the same level characteristics of the laser device was obtained even when they were connected by a straight line respectively.

This laser device oscillated at a wavelength of 630 to 690 nm and the threshold current at the room temperature was 20 to 40 mA. When the length of the resonator was optimized, the maximum optical output reached 150 to 200 mW and high output stable operations of 70 mW to 100 mW were assured at 90° C. The operation of the laser device was continued for more than 5000 hours at a temperature of 70° C. and at an optical output of 70 mW. The stripe structure obtained with this method satisfied the optical output characteristics required by the object optical disk system when driven with a continuous current and a pulse current. The drive unit that uses this laser device will thus be applicable favorably for a rewritable optical recording system.

Second Embodiment

Figure 9:
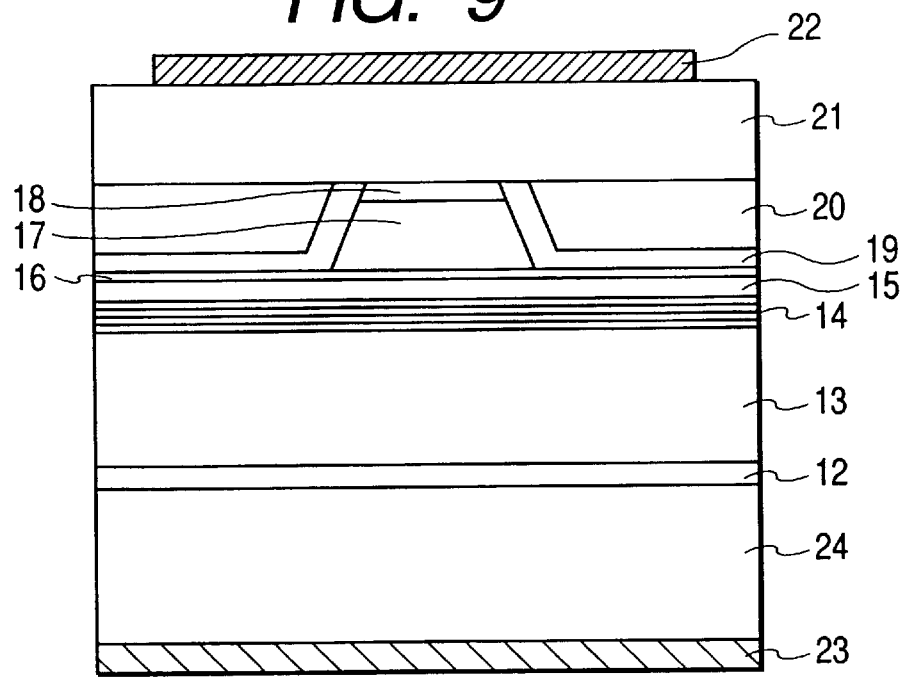
FIG. 9 shows a cross sectional view of the structure of the laser device in the second embodiment of the present invention.
Figure 10:
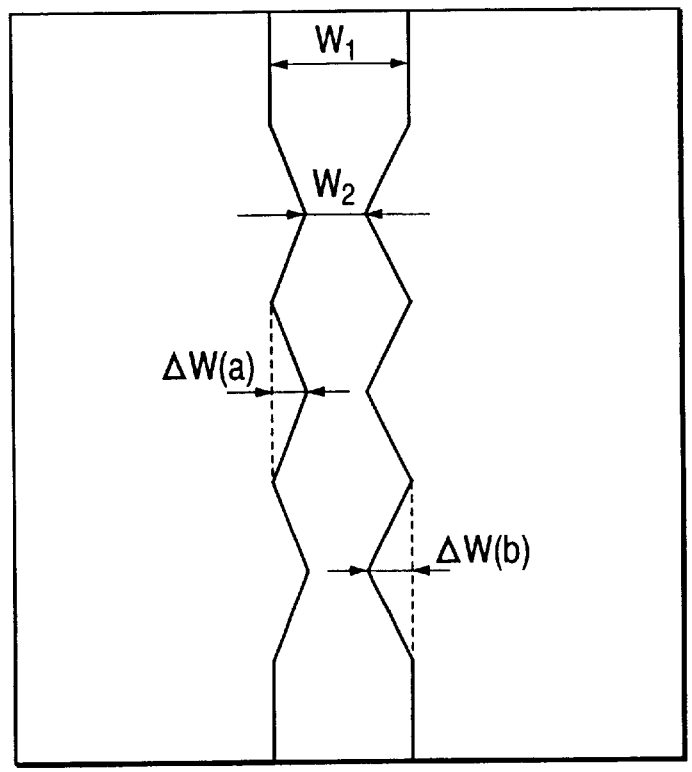
FIG. 10 shows a top view of the stripe structure of the laser device of the present invention in the second embodiment.

Hereunder, the second embodiment for the configuration of the semiconductor laser device comprising of a stripe structure having asymmetric right and left sides will be described. Although the laser device was manufactured just like in the first embodiment, the laser device in this embodiment was manufactured using the n-type GaAs substrate 24 with (100) orientation instead of the misoriented substrate 11 as shown in FIG. 4. After this, the laser device was manufactured just like in the first embodiment. A ridge-shaped stripe waveguide was then formed on both layers 17 and 18 as follows. A ridge-shaped stripe waveguide is etched in the status shown in FIG. 9, so that the stripe structure becomes symmetric at the right and left sides in the optical waveguide layer on the (100) oriented substrate. In this embodiment, however, the ridge-shaped stripe structure was formed so that the relationship between the width of the left side concave ΔW(a) and the width of the right side concave ΔW(b) was not set to ΔW(a)=ΔW(b), but set to ΔW(a)<ΔW(b) as shown in FIG. 10. The stripe optical waveguide in this embodiment therefore became asymmetric at the right and left sides due to the effective difference between the refractive indexes in the lateral direction of the active layer, which was corresponding to the right and left sides of the stripe structure, as well as the difference of the optical losses in the optical waveguide between the coupling of the fundamental traverse-mode and the coupling mode with the high order mode. Consequently, when the laser light propagated in the stripe optical waveguide and resonated by making a round trip in the resonator, the laser light came to be propagated in the stripe optical waveguide structure formed asymmetrically at the right and left sides. Therefore, the beam steering phenomenon was prevented by avoiding the conditions indicated as a relational expression for the difference between the propagation coefficients and the length of the resonator. The above conditions cause the coupling and the mutual interference of the fundamental traverse-mode and the first-order mode. As for the widths of the stripe waveguide W1 and W2 shown in FIG. 10, W1 was set within a range of 4.0 µm to 6.0 µm and W2 was set within a range of 3.0 µm to 5.0 um. At ΔW(a)+ΔW(b)=W1−W2, ΔW(a) was set to within a range of 0.1 µm to 1.0 µm and ΔW(b) was set to within the range of 0.2 µm to 1.5 um. In order to stabilize the waveguide shape in the fundamental traverse-mode, the waveguide was provided with a strait stripe area around the facets of the resonator. After this, the laser device was manufactured completely in the same way as in the first embodiment, thereby giving the laser light a cross sectional view as shown in FIG. 9. With the stripe structure formed such way, the fundamental traverse-mode was controlled stably, and the optical output-current characteristics had an excellent linearity even when driven with a high current pulse.

According to this embodiment, therefore, the same effect of the asymmetric stripe optical waveguide structure as in the first embodiment can be obtained due to a difference given to between the widths of the right and left concave and convex portions of the ridge-shaped stripe waveguide, which is symmetric in the right and left sides in the cross sectional view, even on the (100) oriented substrate. The laser device in this embodiment can thus propagate the laser light stably in the fundamental traverse-mode even at a high current injection, thereby enabling low threshold high efficient operations with the low optical loss in the waveguide structure. The correspondence of this laser device to a driving current from a drive unit has also been proved to have a fast linearity, which can follow up with current waveforms as shown in FIG. 7. The optical output-current characteristics of this laser device can obtain an excellent linearity up to a higher level than that of the optical output for writing in memories. Even at a fast pulse current injection, no degradation was recognized in both height and width of the injection current signal and the linear responsibility of the optical output was proved to be favorable as shown in FIG. 8.

This laser device oscillated at a wavelength of 630 to 690 nm and the threshold current under the room temperature was to 40 mA. When the length of the resonator was optimized, the maximum optical output reached 150 to 200 mW and high output stable operations were assured from 70 to 100 mW and at a temperature of 90° C. The operation of the laser device was continued for more than 5000 hours at 70° C. and at an optical output of 70 mW. With the stripe structure formed such way, the laser device satisfied the optical output characteristics required by optical disk systems when driven with a continuous current and a pulse current. This embodiment has thus proved to be possible to provide a drive unit that employs this laser device for a rewritable optical recording system.

If the laser device used a substrate 11 or 24 and formed an InGaAs compressed strained multiplexed quantum well active layer as an active layer, the laser device oscillated at a wavelength of 970 to 985 mm and the threshold current under the room temperature was 10 to 30 mA. When the length of the resonator was optimized, the maximum optical output reached 800 to 1000 mW and high output stable operations were assured from 500 to 600 mW at a temperature of 90° C. The operation of the laser device was continued for more than 100,000 hours at 70° C. and at an optical output of 500 mW. With the stripe structure formed such way, the laser device satisfied the optical output characteristics, which were specifications of a light source for exciting optical fibers, required by optical communication systems when driven with a continuous current and a pulse current. This embodiment has thus proved to be possible to provide this laser device for an optical communication system that uses this laser device as a light source for exciting optical fibers.

Third Embodiment

Figure 11:
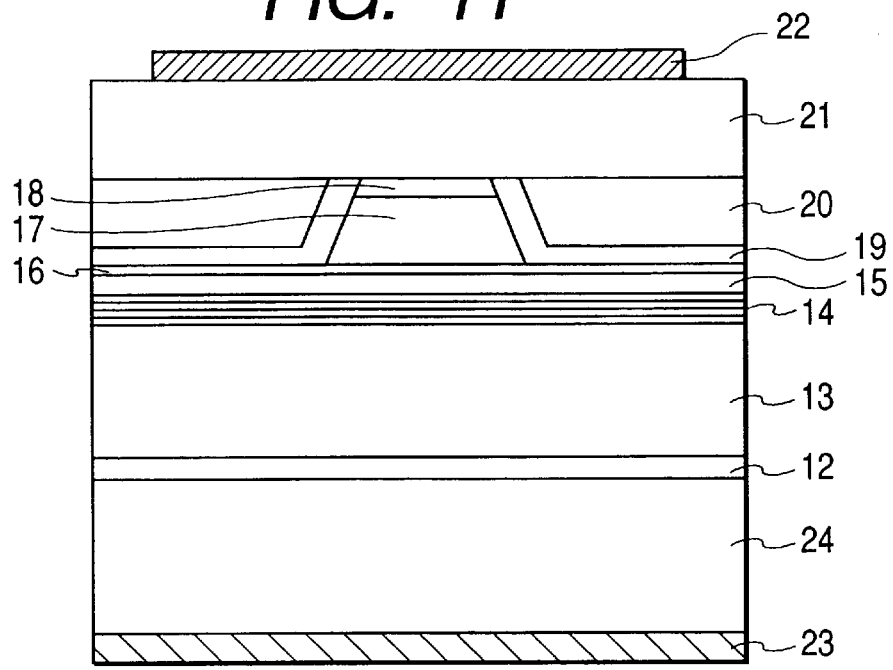
FIG. 11 shows a cross sectional view of the structure of the laser device in the third embodiment of the present invention.
Figure 12:
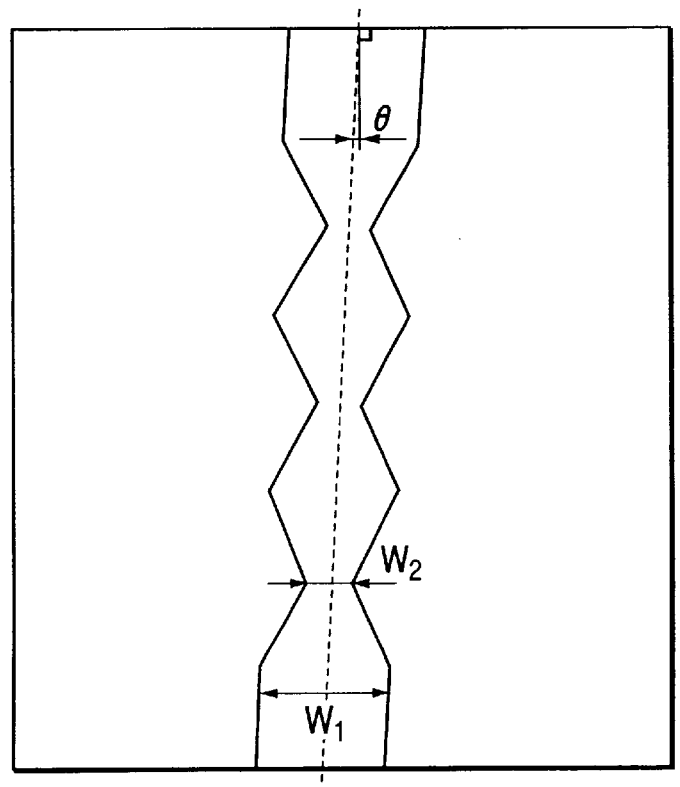
FIG. 12 shows a top view of the stripe structure of the laser device in the third embodiment of the present invention.

Hereunder, the third embodiment for the configuration of the semiconductor laser device of the present invention will be described. The laser device is provided with a stripe structure having asymmetric right and left sides. At first, the laser device was manufactured on an n-type GaAs substrate 24 having a (100) orientation as shown in FIG. 11 just like in the first and second embodiments. Although the top view of the ridge-shaped stripe waveguide was as shown in FIG. 12 at this time, the stripe width was modulated periodically so as to form symmetric concave portions in the resonator. As for the stripe widths W1 and W2 shown in FIG. 12, W1 was set within a range of 4.0 µm to 6.0 µm and W2 was set within a range of 3.0 µm to 5.0 um. At 2ΔW=W1−W2, ΔW was set within a range of 0.3 µm to 1.5 um. In this embodiment, in order to provide the stripe optical waveguide with asymmetric right and left sides, the center line of the stripe structure was set so that the laser device was not oriented vertically to the face of the resonator, but inclined at an irradiation angle of the laser light. FIG. 12 shows the center line of the stripe structure with a dotted line. The waveguide structure was thus inclined to the facets of the resonator at an irradiation angle θ provided between this center line and a line vertical to the facets of the resonator. Actually, the angle θ of the inclined stripe structure to the facets of the resonator was set within a range of 0° to 0.5° including 0°. This θ angle should be set within the range of 0.1° to 0.3°, so that the laser light is applied to the facets. of the resonator at the angle θ. Consequently, when the laser light propagated in the stripe optical waveguide and resonated by making a round trip in the resonator, the laser light came to be propagated in the stripe optical waveguide structure formed asymmetrically at the right and left sides. Therefore, the beam steering phenomenon was prevented by avoiding the conditions indicated as a relational expression for the difference between the propagation coefficients and the length of the resonator. The above conditions cause the coupling and the mutual interference of the fundamental traverse-mode and the first-order mode. With such the stripe structure in this embodiment, therefore, this embodiment can control the fundamental traverse-mode stably and obtain the optical output-current characteristics with an excellent linearity even when the laser device is driven with a high current pulse.

According to this embodiment, therefore, it is possible to compose a ridge-shaped optical waveguide with asymmetric right and left sides and with an irradiation angle θ to the facets of the resonator towards the resonator, thereby forming a semiconductor laser device having a real part refractive index waveguide structure embedded with a material of a lower refractive index and a larger bandgap energy than those of the ridge-shaped stripe structure. Consequently, the laser light can be propagated stably in the fundamental traverse-mode and achieve low threshold high efficient operations with the low optical loss in the waveguide structure. The correspondence of this laser device to a driving current from a drive unit has also been proved to have a fast linearity, which can follow up with current. waveforms as shown in FIG. 7. The optical output-current characteristics of this laser device can obtain an excellent linearity up to a higher level than that of the optical output for writing in memories. In addition, even at a fast pulse current injection, no degradation was recognized in both height and width of the injection current signal and the linear responsibility of the optical output was proved to be favorable as shown in FIG. 8.

This laser device oscillated at a wavelength of 630 to 690 nm and the threshold current under the room temperature was 20 to 40 mA. When the length of the resonator was optimized, the maximum optical output reached 150 to 200 mW and high output stable operations were assured from 70 to 100 mW at a temperature of 90° C. The operation of the laser device was continued for more than 5000 hours at 70° C. and an optical output of 70 mW. With the stripe structure formed such way, the laser device satisfied the optical output characteristics required by optical disk systems when driven with a continuous current and a pulse current. This embodiment has thus proved to be possible to provide a drive unit that employs this laser device for a rewritable optical recording system.

Fourth Embodiment

Figure 13:
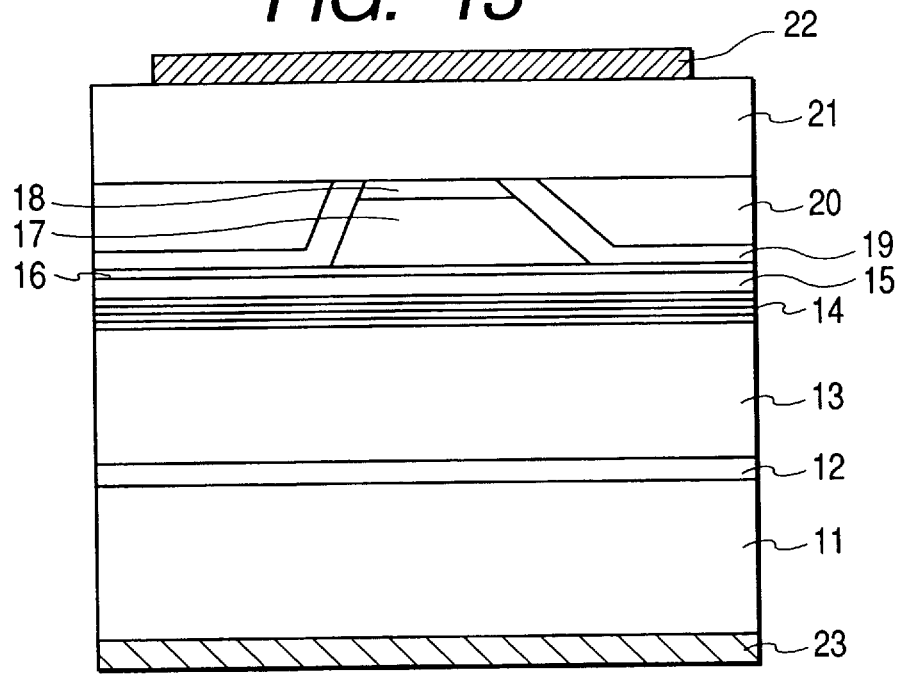
FIG. 13 shows a cross sectional view of the structure of the laser device in the fourth embodiment of the present invention.
Figure 14:
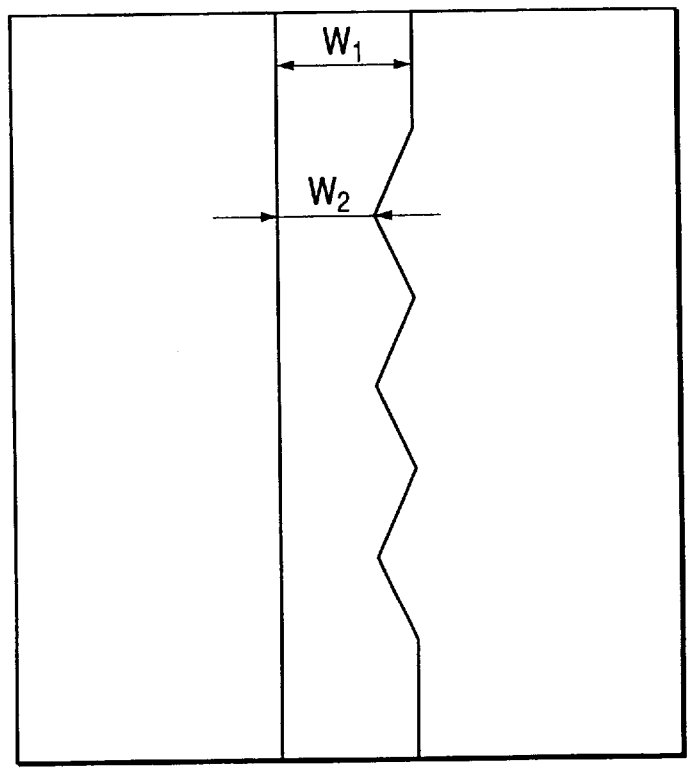
FIG. 14 shows a top view of the stripe structure of the laser device in the fourth embodiment of the present invention.

Hereunder, the fourth embodiment for the configuration of laser device of the present invention will be described. The laser device in this embodiment was manufactured using the same n-type GaAs substrate 11 with 10° misorientation to [011] orientation from (100) orientation as the crystal substrate shown in FIG. 4. Therefore, the laser device was manufactured just like in the first embodiment. But, a ridge-shaped stripe waveguide was formed on both layers 17 and 18 as follows. The ridge-shaped stripe waveguide was etched in the status shown in FIG. 13, so that the optical stripe waveguide was provided with asymmetric right and left sides in the waveguide layer formed on the oriented substrate. The left side was thus inclined sharply and the right side was inclined gently as shown in FIG. 13. As shown in the top view in FIG. 14, the waveguide was modulated periodically only at the gently inclined right side (stripe area), while the left side stripe side was formed straight. Unlike in the first embodiment, therefore, the stripe structure in this embodiment was provided with a straight face at one side just like in the third embodiment. The stripe waveguide was thus composed so as to have asymmetric right and left sides and not inclined to the facets of the resonator. Since a gentle refractive index difference was built in at the right side in this embodiment, the waveguide could put the first order mode under the cut-off condition due to the periodically modulated width designed as shown in FIG. 14. Consequently, the waveguide increased the optical loss effectively in the waveguide in the first order mode. As for the widths of the stripe waveguide W1 and W2 shown in FIG. 14, W1 was set within a range of 4.0 $\mu$m to 6.0 $\mu$m and W2 was set within a range of 3.5 $\mu$m to 5.5 um. At $\Delta W=W1-W2$, $\Delta W$ was set to within a range of 0.1 $\mu$m to 1.5 um. In order to stabilize the propagation of the laser light in the fundamental traverse-mode, the waveguide was provided with a strait stripe area around the facets of the resonator. After this, the laser device was manufactured completely in the same way as in the first, second, and third embodiments, thereby obtaining a cross sectional view for the laser device as shown in FIG. 13.

According to this embodiment, therefore, the same effect of the asymmetric stripe structure as in the first, second, and third embodiments was obtained. The laser device in this embodiment can thus propagate the laser light stably in the fundamental traverse-mode even at a high current injection, thereby enabling low threshold high efficient operations with the low optical loss in the waveguide. The correspondence of this laser device to a driving current from a drive unit has also been proved to have a fast linearity, which can follow up with a current waveform as shown in FIG. 7. In addition, the optical output-current characteristics of this laser device obtained an excellent linearity up to a higher level than that of the optical output for writing in memories. Even at a fast pulse current injection, no degradation was recognized in both height and width of the injection current signal and the linear responsibility of the optical output was proved to be favorable as shown in FIG. 8.

This laser device oscillated at a wavelength of 630 to 690 nm and the threshold current under the room temperature was 20 to 40 mA. When the length of the resonator was optimized, the maximum optical output reached 150 to 200 mW and high output stable operations were assured from 70 to 100 mW at a temperature of 90° C. The operation of the laser device was continued for more than 5000 hours at 70° C. and at an optical output of 70 mW. With the stripe structure formed such way, the laser device satisfied the optical output characteristics required by optical disk systems when driven with a continuous current and a pulse current. This embodiment has thus made it possible to use a drive unit that employs this laser device for a rewritable optical recording system.

Fifth Embodiment

Figure 15:
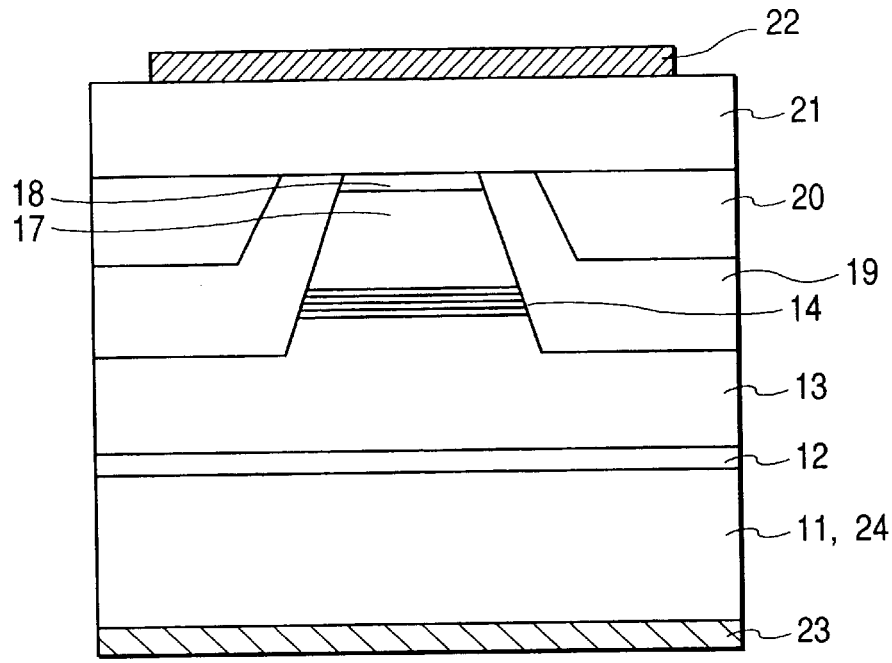
FIG. 15 shows a cross sectional view of the structure of the laser device in the fifth embodiment of the present invention.

Next, the fifth embodiment for the configuration of the laser device of the present invention will be described. Although the laser device in this embodiment was manufactured using an n-type GaAs inclined substrate 11, which was 10° misoriented to the [011] orientation from the (100) orientation as the crystal substrate, as well as an n-type GaAs substrate 24 having an (100) orientation just like in the first to fourth embodiments, the stripe structure was formed as follows. In FIG. 15, the layers 17 and 18 were etched until the layer 13 appeared. After this, a high resistance AlGaAs or an AlGaInP or AlInP current blocking layer 19 and a high resistance GaAs current blocking layer 20 were embedded and grown selectively using the MOVPE method. Consequently, an index-guided structure was formed so as to embed the emission active layer 14 with the layer 19. The layer 19 is a layer whose bandgap energy is larger than that of the emission active layer 14, at least, larger than the energy of the laser light corresponding to the oscillation wavelength. The layer 19 did not absorb the laser light and it was conditioned to have a real-part index-guided structure that satisfied a refractive index smaller than that of the emission active layer 14. As a result, a real-part index-guided waveguide structure was formed so as to have a real refractive index difference in the lateral direction of the active layer. This layer 19 reduced the optical loss in the waveguide effectively and enabled forming of the waveguide structure. And furthermore, the stripe waveguide was formed just like in the first, second, or third embodiment so as to modulate the concave width thereof, obtaining a cross sectional view for the laser device as shown in FIG. 15.

According to this embodiment, therefore, the same effect of the asymmetric stripe structure as in the first, second, third, and fourth embodiments was obtained. The laser device in this embodiment was thus propagated the laser light stably in the fundamental traverse-mode even at a high current injection, thereby enabling low threshold high efficient operations with the low optical loss in the waveguide. The correspondence of this laser device to a driving current from a drive unit was also proved to have a fast linearity, which could follow up with a current waveform as shown in FIG. 7. In addition, the optical output-current characteristics of this laser device obtained an excellent linearity up to a higher level than that of the optical output for writing in memories. Even at a fast pulse current injection, no degradation was recognized in both height and width of the injection current signal and the linear responsibility of the optical output was proved to be favorable as shown in FIG. 8.

This laser device oscillated at a wavelength of 630 to 690 nm and the threshold current under the room temperature was 10 to 30 mA. When the length of the resonator was optimized, the maximum optical output reached 100 to 150 mW and high output stable operations were assured from 50 to 80 mW at a temperature of 90° C. The operation of the laser device was continued for more than 5000 hours at 70° C. and at an optical output of 60 mW. With the stripe structure formed such way, the laser device satisfied the optical output characteristics required by optical disk systems when driven with a continuous current and a pulse current. This embodiment has thus made it possible to provide a drive unit that employs this laser device for a rewritable optical recording system.

When an InP substrate was used as the substrate 11 or 24 and an InGaAsP/InGaAsP compressed strained multiplexed quantum well active layer and an InP optical waveguide layer were used as an active layer and as an optical waveguide layer respectively, as well as the laser device is provided with a high resistance InP embedding layer on the layers 19 and 20, the laser device oscillated at a wavelength of 1300 to 1350 nm and the threshold current under the room temperature was 2 to 10 mA. When the length of the resonator was optimized, the maximum optical output reached 50 to 100 mW and high output stable operations were assured from 20 to 30 mW at a temperature of 90° C. The operation of the laser device was continued for more than 100,000 hours at 85° and at an optical output of 10 mW. With the stripe structure formed such way, the laser device satisfied the optical output characteristics required by optical communication systems when driven with a continuous current and a pulse current. This embodiment has thus proved to be possible to provide this laser device for an optical communication system that uses this laser device as a light source.

Sixth Embodiment

Figure 16:
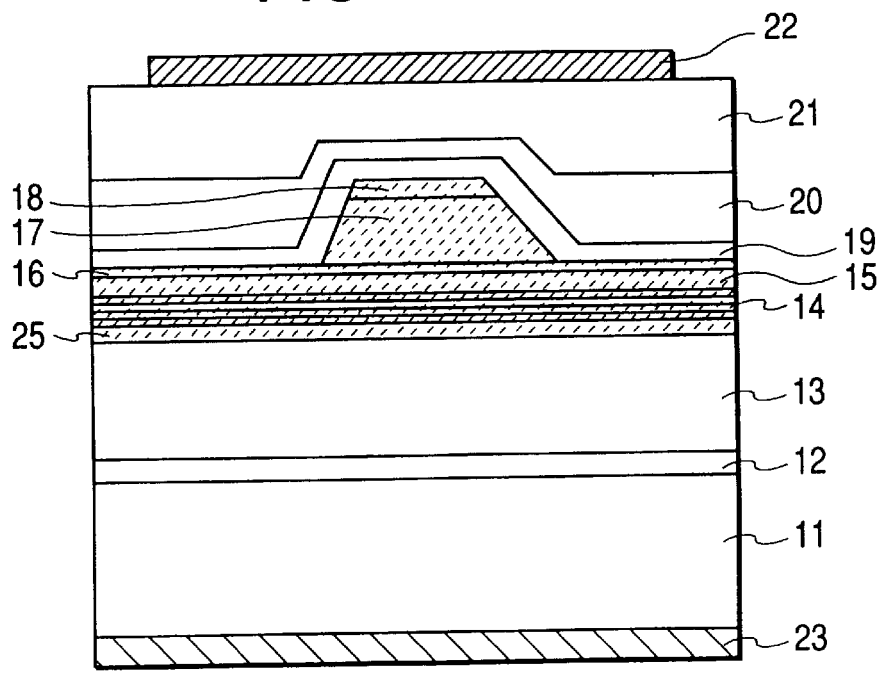
FIG. 16 shows a cross sectional view of the structure of the laser device in the sixth embodiment of the present invention.
Figure 17:
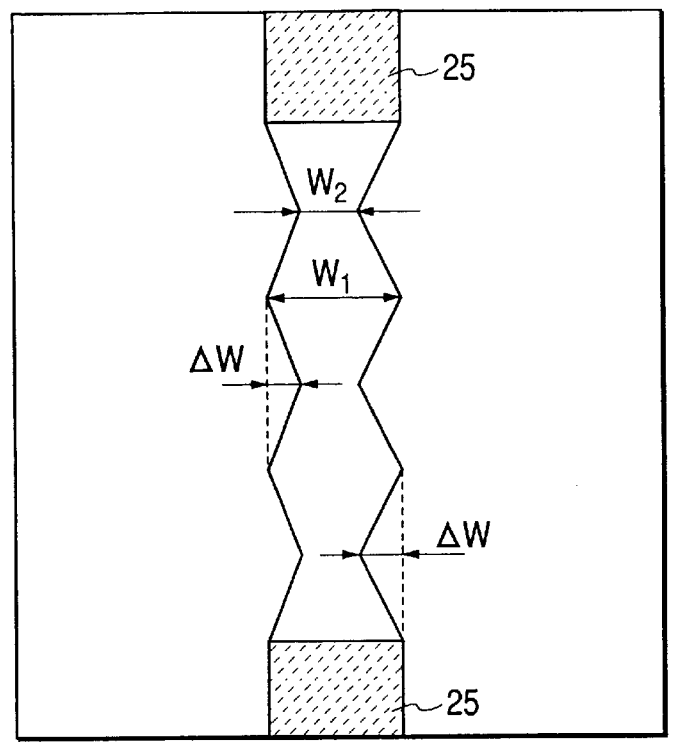
FIG. 17 shows a top view of the stripe structure of the laser device in the sixth embodiment of the present invention.

Next, the sixth embodiment for the configuration of the laser device of the present invention will be described with reference to FIGS. 16 and 17. The laser device in this embodiment was manufactured just like in the first embodiment. In this embodiment, however, a crystal growing process was done for up to the layer 18, then a mask was formed in photo lithography and etching processes. After this, impurities were implanted by means of solid diffusion or ion implantation, followed by a thermal annealing process, thereby forming an impurity diffused area 25 through the layer 13. At this time, this impurity diffused area was formed around the facets of the resonator. The area was equivalent to a straight area for stabilizing the propagation of the laser light in the fundamental traverse-mode. In this impurity diffused area, a sublattice ordered structure was formed as a multiplexed quantum well structure and compositions were intermixed, so that the energy of the area was set larger than the bandgap energy of the active layer 14 in the resonator, at least, larger than the energy of the laser light corresponding to the oscillation wavelength. Preferably, the difference between those energies should be 100 meV or over in the area. Consequently, the waveguide could compose a window structure transparent to the laser light in the area around the facets of the resonator. After this, a stripe structure was formed so as to be inclined from the resonator as shown in the cross sectional view in FIG. 16 and the top view in FIG. 17. At this time, each part of the stripe structure was designed just like in the first embodiment. While the insulating film was removed from around the facets of the resonator, the layers 19 and 20 were formed so as to cover the ridge-shaped waveguide structure as shown in FIG. 16. In the resonator, the layers 19 and 20 were grown selectively at both sides of the ridge-shaped stripe structure while the insulating film mask was left as was, giving a cross sectional view for the laser device as shown in FIG. 4 in the first embodiment. At this time, the layers 19 and 20 formed around the facets of the resonator functioned as a non-injection current region respectively for the impurity diffused region. The length of the non-injection current region from the facets of the resonator was set longer than the length of the impurities diffused region. The length of the non-injection current region should preferably be from 5 $\mu$m to 50 $\mu$m from the impurity diffused region, more preferably from 10 $\mu$m to 40 $\mu$m. This non-injection current region prevented generation of a leakage current from the impurity diffused region. The window structure thus obtained the effect of the window structure enough without increasing the optical loss of the laser light propagated in the waveguide. After this, the laser device was manufactured completely in the same way as in the first embodiment, giving the laser device a cross sectional view shown in FIG. 16 and a top view as shown in FIG. 17.

According to this embodiment, the bandgap energy of the window structure can be set larger than that in the resonator, thereby obtaining a laser device protected from the phenomenon of catastrophic optical damage completely and possible to improve the maximum optical output up to a level for saturating the optical output with a heat. The other basic characteristics of the laser device were the same as those of the first embodiment. The correspondence of this laser device to a driving current from a drive unit had a fast linearity for following up with current waveforms as shown in FIG. 7. The optical output-current characteristics of this laser device obtained an excellent linearity up to a higher level than that of the optical output for writing in memories. Even at a fast pulse current injection, the linear responsibility of the optical output was proved to be favorable as shown in FIG. 8.

This laser device oscillated at a wavelength of 630 to 690 nm and the threshold current under the room temperature was 20 to 30 mA. When the length of the resonator was optimized, the maximum optical output reached 300 to 350 mW and high output stable operations of at least 150 mW were assured at a temperature of 90° C. The operation of the laser device was continued for more than 10,000 hours. With the stripe structure formed such way, the laser device satisfied the optical output characteristics required by optical disk systems when driven with a continuous current and a pulse current. This embodiment has thus made it possible to provide a drive unit that employs this laser device for a rewritable optical recording system.

When a substrate 11 or 24 was used and an InGaAsP compressed stained multiplexed quantum well active layer was employed as an active layer, the laser device oscillated at a wavelength of 970 to 985 mm and the threshold current under the room temperature was 10 to 30 mA. When the length of the resonator was optimized, the maximum optical output reached 1000 to 1200 mW and high output stable operations of 700 mW to 800 mW were assured at a temperature of 90° C. The operation of the laser device was continued for more than 100,000 hours at 70° C. and at an optical output of 700 mW. With the stripe structure formed such way, the laser device satisfied the optical output characteristics, which were specifications of a light source for exciting optical fibers, required by optical communication systems when driven with a continuous current and a pulse current. This embodiment has thus made it possible to provide this laser device for an optical communication system as its light source.

Seventh Embodiment

Figure 18:
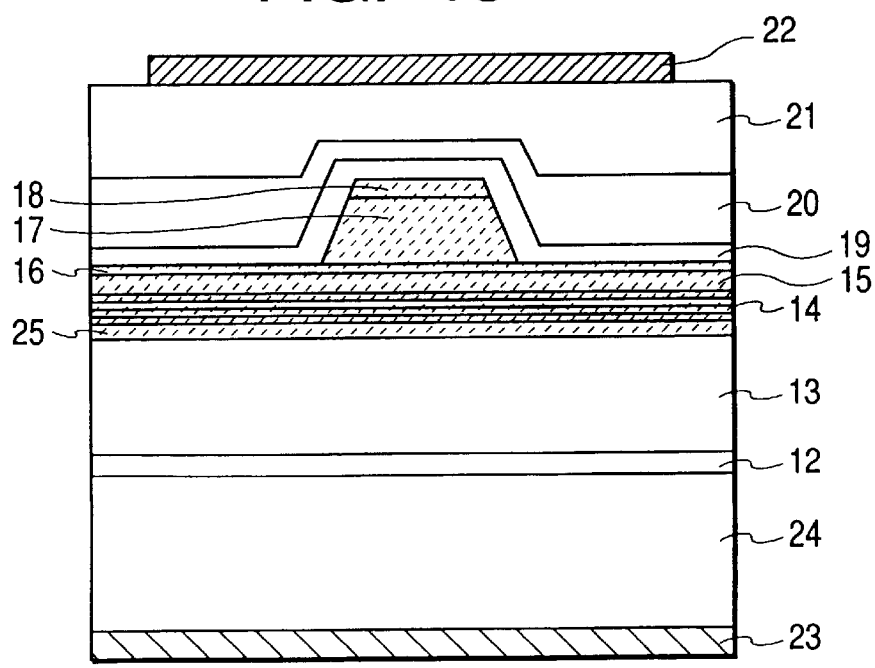
FIG. 18 shows a top view of the stripe structure of the laser device in the seventh embodiment of the present invention.
Figure 19:
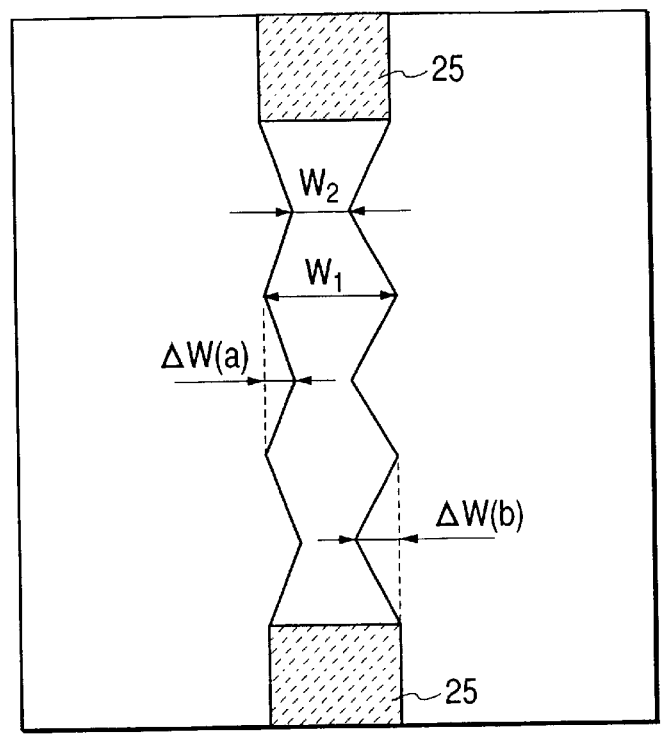
FIG. 19 shows a top view of the stripe structure of the laser device in the seventh embodiment of the present invention.

Hereunder, the seventh embodiment for the configuration of the laser device of the present invention will be described with reference to FIGS. 18 and 19. Although the laser device in this embodiment was manufactured just like in the second embodiment, the impurity diffused region and the non-injection current region were formed just like in the sixth embodiment. After that, the laser device was manufactured completely in the same way as in the second embodiment, giving the laser device a cross section view as shown in FIG. 18 and a top view as shown in FIG. 19.

This embodiment has thus obtained the same effect of the window structure as that in the sixth embodiment with respect to the maximum optical output. The semiconductor laser device in this embodiment was thus protected completely from the phenomenon of catastrophic optical damage and made the optical output saturate with a heat. The other basic characteristics of the laser device were the same as those of the third embodiment. The correspondence of this laser device to a driving current from a drive unit was also proved to have a fast linearity, which could follow up with current waveforms as shown in FIG. 7. The optical output-current characteristics of this laser device obtained an excellent linearity up to a higher level than that of the optical output for writing in memories. Even at a fast pulse current injection, the linear responsibility of the optical output was proved to be favorable as shown in FIG. 8.

This laser device oscillated at a wavelength of 630 to 690 nm and the threshold current under the room temperature was 20 to 30 mA. When the length of the resonator was optimized, the maximum optical output reached 300 to 350 mW and high output stable operations of at least 150 mW were assured at a temperature of 90° C. The operation of the laser device was continued for more than 10,000 hours. With the stripe structure formed such way, the laser device satisfied the optical output characteristics required by optical disk systems when driven with a continuous current and a pulse current. This embodiment has thus made it possible to provide a drive unit that employs this laser device for a rewritable optical recording system.

Eighth Embodiment

Figure 20:
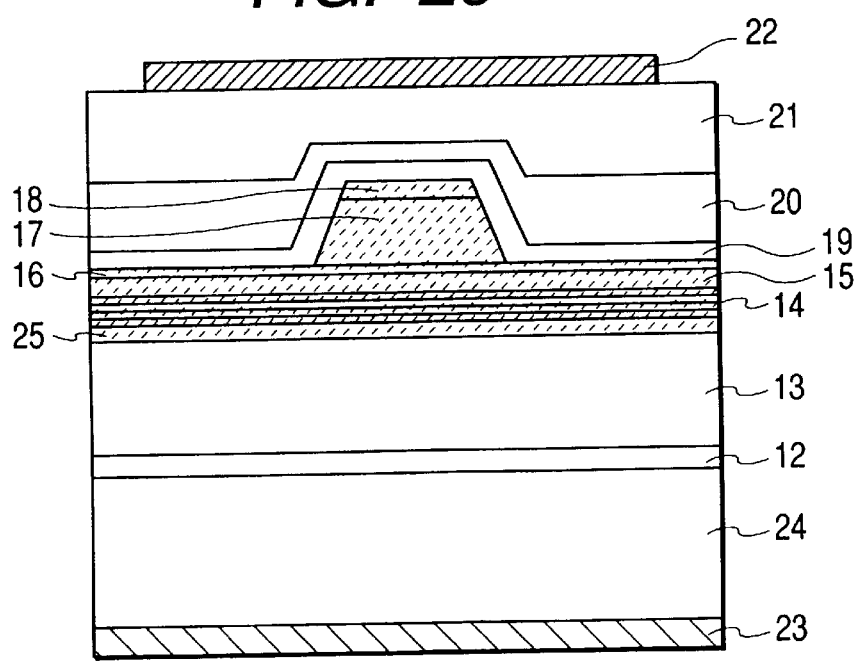
FIG. 20 shows a cross sectional view of the structure of the laser device in the eighth embodiment of the present invention.
Figure 21:
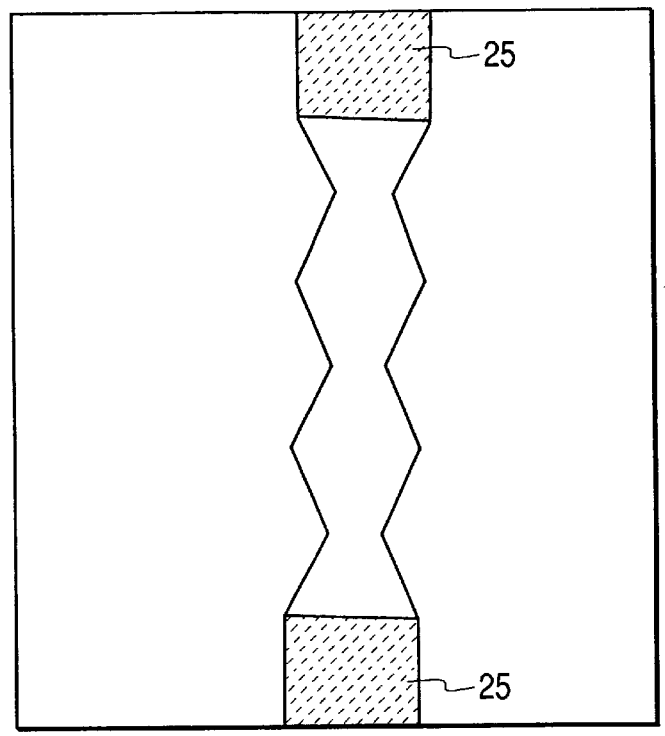
FIG. 21 shows a top view of the stripe structure of the laser device in the eighth embodiment of the present invention.

Hereunder, the eighth embodiment for the configuration of the laser device of the present invention will be described with reference to FIGS. 20 and 21. Although the laser device in this embodiment was manufactured just like in the third embodiment, the impurity diffused region and the non-injection current region were formed just like in the sixth and seventh embodiments. After that, the laser device was manufactured completely in the same way as in the third embodiment, giving the laser device a cross sectional view as shown in FIG. 20 and a top view as shown in FIG. 21.

According to this embodiment, the same effect of the window structure as that in the sixth and seventh embodiments was obtained with respect to the maximum optical output. The semiconductor laser device in this embodiment was thus protected completely from the phenomenon of catastrophic optical damage and improved the maximum optical output up to a level, which made the optical output saturate with a heat. The other basic characteristics of the laser device were the same as those of the third embodiment. The correspondence of this laser device to a driving current from a drive unit was also proved to have a fast linearity, which could follow up with current waveforms as shown in FIG. 7. The optical output-current characteristics of this laser device obtained an excellent linearity up to a higher level than that of the optical output for writing in memories. Even at a fast pulse current injection, the linear responsibility of the optical output was proved to be favorable as shown in FIG. 8.

This laser device oscillated at a wavelength of 630 to 690 nm and the threshold current under the room temperature was 20 to 30 mA. When the length of the resonator was optimized, the maximum optical output reached 300 to 350 mW and high output stable operations of at least 150 mW were assured at a temperature of 90° C. The operation of the laser device was continued for more than 10,000 hours. With the stripe structure formed such way, the laser device satisfied the optical output characteristics required by optical disk systems when driven with a continuous current and a pulse current. This embodiment has thus made it possible to provide a drive unit that employs this laser device for a rewritable optical recording system.

Ninth Embodiment

Figure 22:
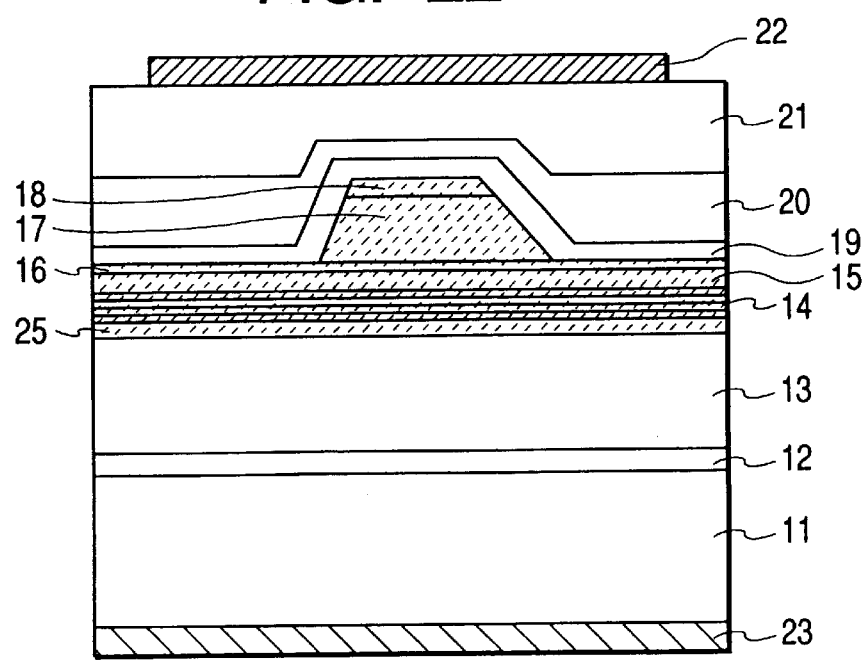
FIG. 22 shows a cross sectional view of the structure of the laser device in the ninth embodiment of the present invention.
Figure 23:
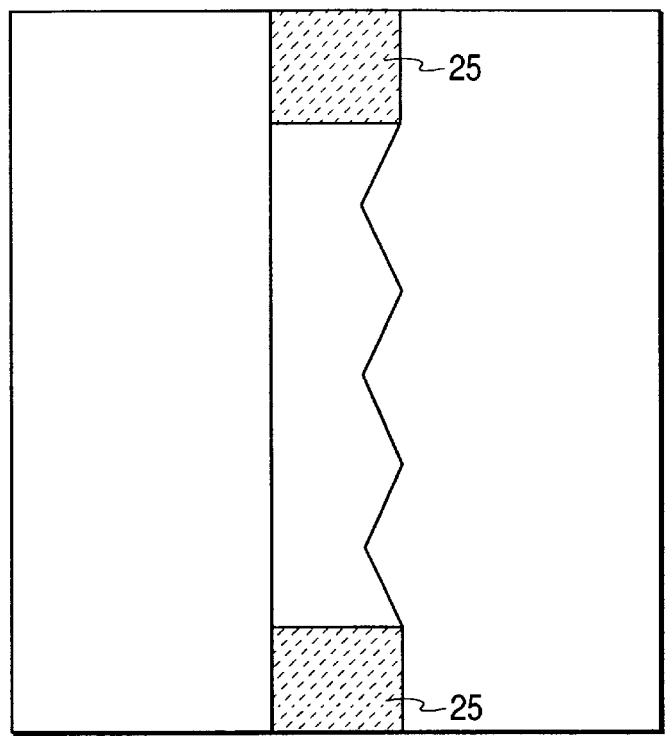
FIG. 23 shows a top view of the stripe structure of the laser device in the ninth embodiment of the present invention.

Hereunder, the ninth embodiment for the configuration of the laser device of the present invention will be described with reference to FIGS. 22 and 23. Although the laser device in this embodiment was manufactured just like in the fourth embodiment, the impurity diffused region and the non-injection current region were formed just like in the sixth to eighth embodiments. After that, the laser device was manufactured completely in the same way as in the fourth embodiment, giving the laser device a cross sectional view as shown in FIG. 22 and a top view as shown in FIG. 23.

According to this embodiment, the same effect of the window structure as that in the sixth to eighth embodiments was obtained with respect to the maximum optical output. The semiconductor laser device was thus protected completely from the phenomenon of catastrophic optical damage and improved the maximum optical output up to a level, which could make the optical output to saturate with a heat. The other basic characteristics of the laser device were the same as those of the fourth embodiment. The correspondence of this laser device to a driving current from a drive unit was proved to have a fast linearity, which could follow up with current waveforms as shown in FIG. 7. The optical output-current characteristics of this laser device obtained an excellent linearity up to a higher level than that of the optical output for writing in memories. Even at a fast pulse current injection, the linear responsibility of the optical output was proved to be favorable as shown in FIG. 8.

This laser device oscillated at a wavelength of 630 to 690 nm and the threshold current under the room temperature was 20 to 30 mA. When the length of the resonator was optimized, the maximum optical output reached 300 to 350 mW and high output stable operations of at least 150 mW were assured at a temperature of 90° C. The operation of the laser device was continued for more than 10,000 hours. With the stripe structure formed such way, the laser device satisfied the optical output characteristics required by optical disk systems when driven with a continuous current and a pulse current. This embodiment has thus made it possible to

Tenth Embodiment

Figure 24:
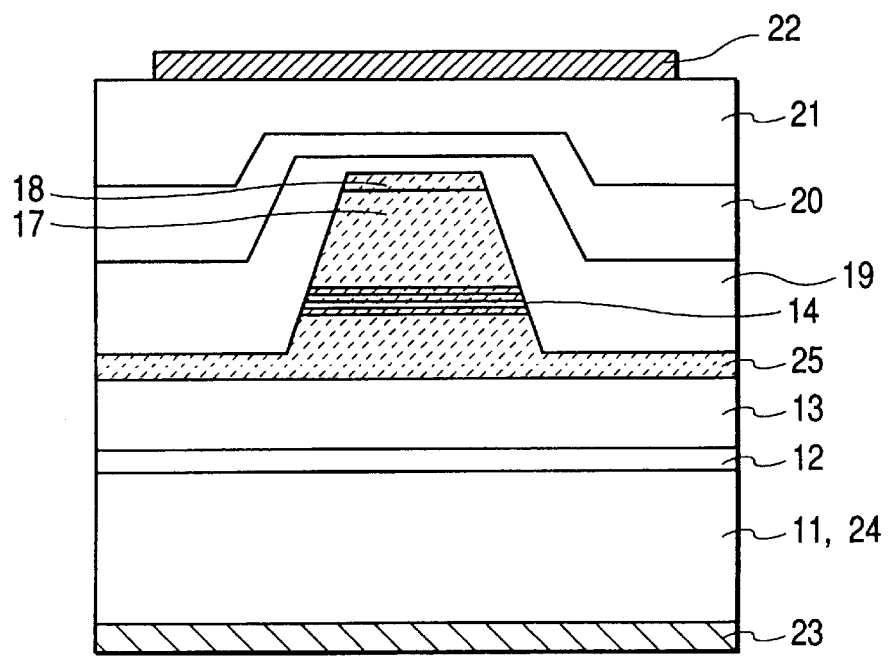
FIG. 24 shows a cross sectional view of the structure of the laser device in the tenth embodiment of the present invention.

Hereunder, the eighth embodiment for the configuration of the laser device of the present invention will be described with reference to FIG. 24. Although the laser device in this embodiment was manufactured just like in the fifth embodiment, the impurity diffused region and the non-injection current region were formed just like in the sixth to ninth embodiments. After that, the laser device was manufactured completely in the same way as in the fifth embodiment, giving the laser device a cross sectional view as shown in FIG. 24 and a top view as shown in FIG. 17, 19, 21, or 23 in the sixth to ninth embodiments.

According to this embodiment, the same effect of the window structure as that in the sixth to ninth embodiments was obtained with respect to the maximum optical output. The semiconductor laser device was thus protected completely from the phenomenon of catastrophic optical damage and improved the maximum optical output up to a level, which could make the optical output to saturate with a heat. The other basic characteristics of the laser device were the same as those of the fifth embodiment. The correspondence of this laser device to a driving current from a drive unit was proved to have a fast linearity, which could follow up with current waveforms as shown in FIG. 7. The optical output-current characteristics of this laser device obtained an excellent linearity up to a higher level than that of the optical output for writing in memories. Even at a fast pulse current injection, the linear responsibility of the optical output was proved to be favorable as shown in FIG. 8.

This laser device oscillated at a wavelength of 630 to 690 nm and the threshold current under the room temperature was 20 to 30 mA. When the length of the resonator was optimized, the maximum optical output reached 300 to 350 mW and high output stable operations of at least 150 mW were assured at a temperature of 90° C. The operation of the laser device was continued for more than 10,000 hours. With the stripe structure formed such way, the laser device satisfied the optical output characteristics required by optical disk systems when driven with a continuous current and a pulse current. This embodiment has thus made it possible to provide a drive unit that employs this laser device for a rewritable optical recording system.

This laser device oscillated at a wavelength of 630 to 690 nm and the threshold current under the room temperature was 10 to 30 mA. When the length of the resonator was optimized, the maximum optical output reached 150 to 200 mW and high output stable operations of at least 90 mW to 120 mW were assured at a temperature of 90° C. The operation of the laser device was continued for more than 5,000 hours at 70° C. and at an optical output of 90 mW. With the stripe structure formed such way, the laser device satisfied the optical output characteristics required by optical disk systems when driven with a continuous current and a pulse current. This embodiment has thus made it possible to provide a drive unit that employs this laser device for a rewritable optical recording system.

When an InP substrate was used as the substrate 11 or 24, and an InGaAsP/InGaAsP compressed strained multiplexed quantum well active layer and an InP optical waveguide layer were employed as an active layer and as an optical waveguide layer respectively, as well as the laser device was provided with a high resistance InP embedding layer on the layers 19 and 20 respectively, the laser device oscillated at a wavelength of 1300 to 1350 nm and the threshold current under the room temperature was 1 to 8 mA. When the length of the resonator was optimized, the maximum optical output reached 70 to 120 mW and high output stable operations were assured from 40 to 50 mW at a temperature of 90° C. The operation of the laser device was continued for more than 10,000 hours at 85° and at an optical output of 20 mW. With the stripe structure formed such way, the laser device satisfied the optical output characteristics required by optical communication systems when driven with a continuous current and a pulse current. This embodiment has thus made it possible to provide this laser device for an optical communication system as a light source.

Eleventh Embodiment

Figure 25:
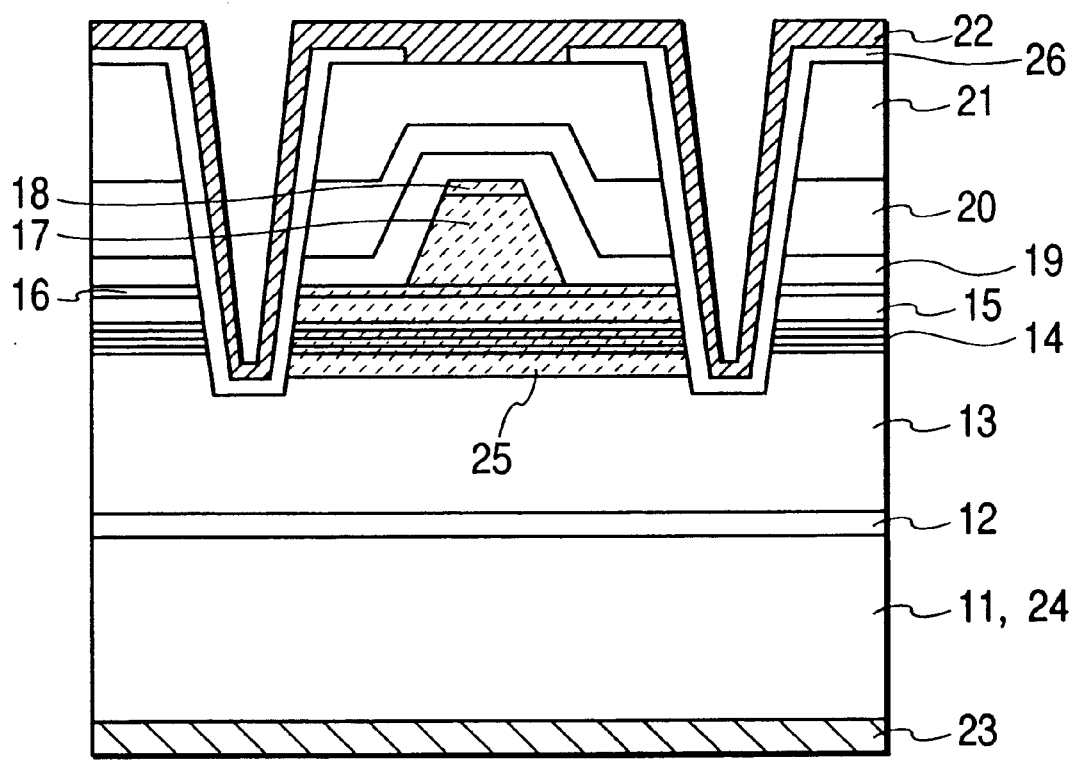
FIG. 25 shows a cross sectional view of the structure of the laser device in the eleventh embodiment of the present invention.
Figure 26A:
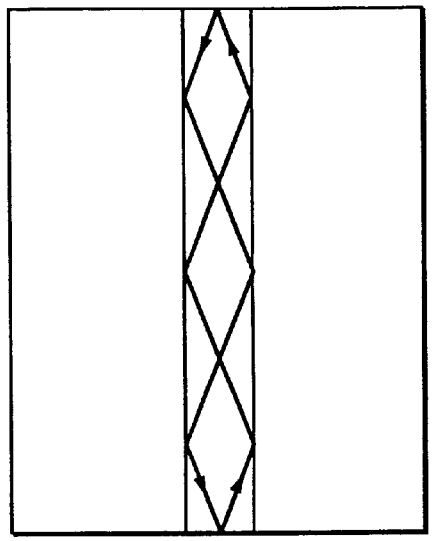
FIG. 26A shows a top view of a laser light propagated in a waveguide in the coupled traverse mode in an embodiment of the conventional stripe optical waveguide structure.
Figure 26B:
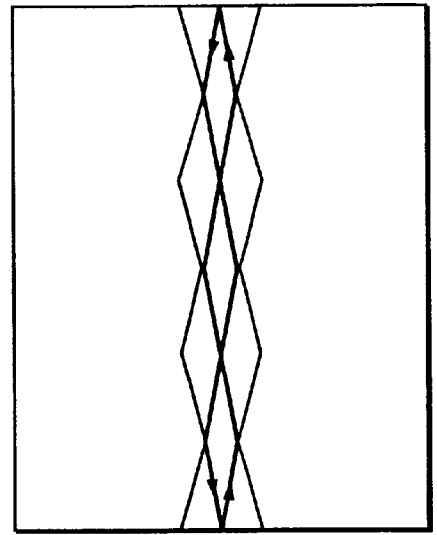
FIG. 26B shows a top view of the laser light propagated in a waveguide in the coupled traverse mode in another embodiment of the conventional stripe optical waveguide structure.
Figure 27A:
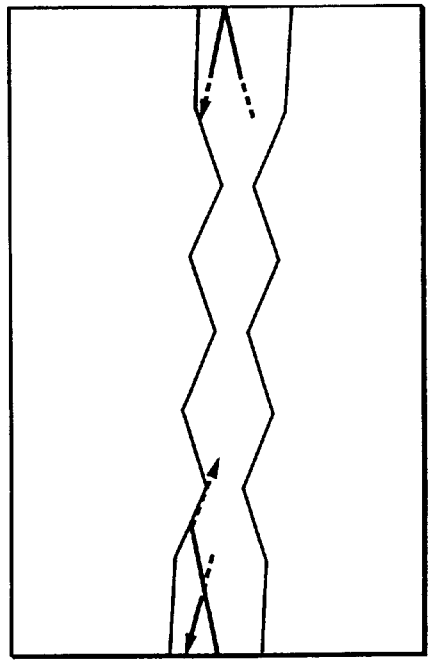
FIG. 27A shows a top view of the laser light propagated in a waveguide in the coupled traverse mode in an embodiment of the stripe optical waveguide structure of the present invention.
Figure 27B:
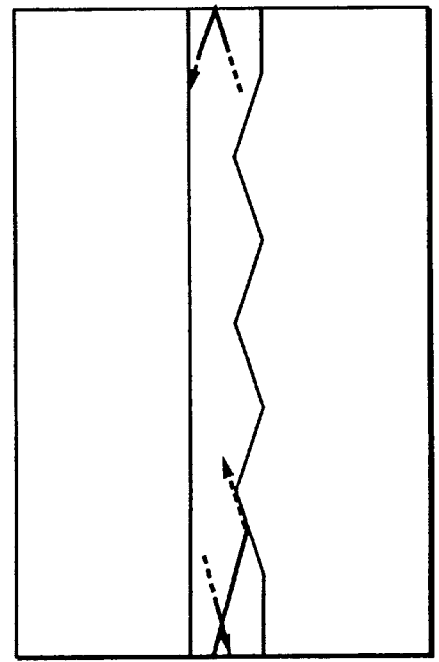
FIG. 27B shows a top view of the laser light propagated in a waveguide in the coupled traverse mode in another embodiment of the stripe optical waveguide structure of the present invention.

Hereunder, the eleventh embodiment for the configuration of the laser device of the present invention will be described with reference to FIG. 25. Although the laser device in this embodiment was manufactured just like in the first to fourth embodiments, grooves were formed at both sides of the stripe structure through photo lithography and etching processes until they reached the layer 13 through the emission active layer 14 as shown in FIG. 25. Then, an insulating film mask 26 was formed on the surface, so that an electrode came in contact only with the stripe waveguide formed between the grooves at both sides of the stripe structure, thereby evaporating the p-side electrode 22. And furthermore, the n-side electrode 23 was evaporated. After this, the laser device was manufactured so as to have the same composition as that in the first to fifth embodiment and the same window structure in the sixth to tenth embodiments for the waveguide structure, giving the laser device a cross sectional view as shown in FIG. 25.

According to this embodiment, since the grooves formed at both sides of the stripe structure were effective to reduce the capacity of the laser device significantly, the laser device obtained the fast high frequency characteristics with which the laser light could follow up with the high frequency current from the object high frequency superposition circuit and the laser light could be modulated fast by a pulse current in a frequency band within a range up to a few GHz band. In an optical disk system, therefore, the laser device (diode) could operate in a multiple longitudinal mode through a high frequency superposition at least when reading from memories, thereby suppressing the modal noise induced by an optical feedback. As a result, the laser device obtained low noise characteristics, which could reduce noises to a noise level of not more than −135 dB/Hz even at 80° C. and even at an optical feedback of 5%. When a rewritable optical disk system used the laser device in this embodiment as a light source, the laser device operated at an optical output of at least 100 mW or over at an ambient temperature of 90° C. and the operation could be continued stably for more than 10,000 hours. This embodiment has thus proved that the laser device will be able to satisfy all the characteristics required for optical disk systems, such as fast responsibility, with an excellent linearity in the fundamental traverse-mode, as well as such characteristics and specifications as low noise and high output.

According to this embodiment, since the grooves formed at both sides of the stripe structure were effective to reduce the capacity of the laser device significantly, the laser device obtained fast high frequency characteristics with which the laser light could follow up with the high frequency current signal used for data transmission in optical communications, thereby enabling fast modulation by a pulse current in the frequency bands up to a few GHz to 10 GHz. The laser device will thus be applicable favorably as a light source for data transmission in an optical communication system.

Twelfth Embodiment

When a light source for a rewritable optical disk system was composed using a laser device manufactured as described in the eleventh embodiment, it was confirmed that the laser device could operate at an optical output of at least 100 mW or over at an ambient temperature of 90° C. The laser device was composed as described in the first to fifth embodiments and provided with a waveguide structure having a window structure formed as described in the sixth to tenth embodiments. The laser device thus satisfied all the required specifications for the above-described system including the fast modulation characteristics, low noise characteristics, etc. when driven with any of other modulated pulses. The rewritable optical disk system, which employed this laser device as a light source of the optical pick-up as shown in FIG. 1 could stand the number of rewriting operations over $10^6$ times and continue the operation for more than 10,000 hours.

The present invention can thus provide a semiconductor laser practicable as a light source with a fast linear responsibility to continuous current and pulse current signals from a driving power supply without causing none of optical output saturation nor non-linear responses, as well as achieve an optical information processing system with practicality and general versatility, which employs the laser device characterized as described above for the drive unit thereof. This method has also made it possible to correct the conventional instability of the laser light in the fundamental traverse-mode and provide the semiconductor laser device with high output stable operations with an excellent linearity and an excellent optical output responsibility to injected currents. The laser device has thus secured the maximum optical output larger than the driving optical output of an optical disk system and obtained a stable optical output of at least 70 mW or over as proper high output characteristics for a light source of such an optical disk system. The laser device could follow up with both height and width of a current waveform even when driven with a pulse current and also operate only in the fundamental traverse-mode with an excellent linear responsibility within the driving optical output and without generating any higher order traverse mode.

Consequently, the laser device has reduced the error rate up to a practicable level even after more than $10^6$ times of recording and reproducing operations and stand a continuous operation of more than 10,000 hours when employed for such a rewritable optical disk drive unit of 2.6 GB or over as a DVD-RAM system, a large capacity optical magnetic recording system, etc.

Although description has been made for a laser device used as a light source for an optical information processing system mainly in this embodiment, the laser device can also be employed as a light source for an optical communication system as described above, as well as for exciting optical fibers and for the transmission in optical communications.

It will further be understood by those skilled in the art that the foregoing description is a preferred embodiment of the disclosed device and that various changes and modifications may be made in the invention without departing from the spirit and scope thereof.

What is claimed is:

1. A semiconductor laser device comprising:
   a resonator structure for generating a laser light formed on a substrate, and
   a stripe optical waveguide provided in said resonator structure,
   wherein said stripe optical waveguide has right and left sides which are different in shape from each other in its cross sectional view cut at a plane vertical to said substrate and parallel to the facets of said resonator structure, and at least one of which has concave and convex portions in the longitudinal direction of said stripe optical waveguide in its top view.

2. A semiconductor laser device according to claim 1, wherein said stripe optical waveguide is set so as not to couple a fundamental traverse-mode of said laser light with its high order mode.

3. A semiconductor laser device according to claim 1 or 2, wherein said stripe optical waveguide has concave and convex portions at both the right and left sides in the longitudinal direction thereof, said concave and convex portions at both the right and left sides being different in shape from each other between the right side and the left side.

4. A semiconductor laser device according to claim 1 or 2, wherein said stripe optical waveguide has concave and convex portions at both the right and left sides in the longitudinal direction thereof, said concave and convex portions at both the right and left sides being the same in shape.

5. A semiconductor laser device according to claim 3, wherein said stripe optical waveguide is formed so that the distance difference between concave and convex portions provided at one side in the longitudinal direction thereof is set larger than the distance difference between concave and convex portions provided at the other side in the longitudinal direction thereof.

6. A semiconductor laser device according to claim 1 or 2, wherein one side of said stripe optical waveguide in the longitudinal direction is formed linearly.

7. A semiconductor laser device according to claim 1 or 2, further comprising a substrate consisting of semiconductor crystal, an emission active layer formed on said substrate, and two optical waveguide layers provided on the upper and the lower surface of said emission active layer respectively,
   wherein said substrate has a misoriented orientation within a range of 0 to 54.7° (111) orientation from (100) orientation, and one of said two optical waveguide layer provided on the upper surface of said emission active layer is formed as a ridge-shaped stripe structure extended along said resonator structure.

8. A semiconductor laser device according to claim 7, wherein said substrate has a misoriented orientation within a range of 5 to 16°.

9. A semiconductor laser device according to claim 7, wherein, in a low ambient temperature, an optical output assumed until a kink occurs area is larger than an optical output assumed until a kink occurs when both sides of said stripe optical waveguide are formed linearly in the longitudinal direction thereof.

10. A semiconductor laser device according to claim 1, wherein said stripe optical waveguide is formed so as to increase and reduce a width thereof at least twice between the facets of said resonator structure, and the center axis of said stripe optical waveguide in a longitudinal direction is inclined to the facets of said resonator structure at an angle θ within $0°<θ≦0.5°$ to an imaginary line vertical to the facets of said resonator structure at the shortest distance.

11. A semiconductor laser device comprising:
    a resonator structure generating a laser light, and a stripe optical waveguide provided in said resonator structure, wherein said stripe optical waveguide is formed so as to increase and reduce its width at least twice between the facets of said resonator structure, and the center axis of said stripe optical waveguide in the longitudinal direction is inclined to the facets of said resonator structure at an angle θ within 0°<θ≦0.5° to an imaginary line vertical to the facets of said resonator structure at the shortest distance.

12. A semiconductor laser device according to claim 11, wherein said angle θ is set within a range of 0°<θ≦0.4°.

13. A semiconductor laser device according to claim 11, wherein said angle θ is set within a range of 0.1°<θ≦0.3°.

14. A semiconductor laser device according to claim 1, 2 or 11, further comprising a substrate consisting of semiconductor crystal, an emission active layer formed on said substrate, two optical waveguide layers provided on the upper and the lower surface of said emission active layer respectively, and a ridge-shaped stripe structure which is formed by processing one of said two optical waveguide layers provided on the upper surface of said emission active layer so as to be extended in the longitudinal direction of said resonator structure, wherein the width of said stripe structure is set so as to obtain an effective refractive index difference in the direction in which said emission active layer crosses the longitudinal direction of said resonator structure so that propagation of said laser light propagated in said emission active layer is stabilized in the fundamental traverse-mode.

15. A semiconductor laser device according to claim 14, further comprising a semiconductor crystal formed at both sides of said ridge-shaped stripe structure so as to embed said stripe structure, said semiconductor crystal having a larger bandgap energy than the bandgap energy of said emission active layer or the energy of the laser light from said emission active layer corresponding to the oscillation wavelength.

16. A semiconductor laser device according to claim 15, wherein said semiconductor crystal embedding both sides of said ridge-shaped stripe structure is set so as to modulate the width of one side of said ridge-shaped stripe structure periodically or the widths of both sides thereof non-periodically, thereby said optical waveguide is formed so that the optical propagation inner loss and said refractive index difference both of which are along said resonator structure in said emission active layer are not changed linearly nor in uniform.

17. A semiconductor laser device according to claim 14, wherein said ridge-shaped stripe structure has an optical waveguide structure, in which the width thereof is modulated and the number of narrowed areas thereof is set according to the number of beating bellys of said laser light in the fundamental traverse-mode in said resonator structure.

18. A semiconductor laser device according to claim 1, 2 or 11, further comprising a substrate consisting of semiconductor crystal, an emission active layer formed on said substrate, and two optical waveguide layers formed on the upper and the lower surf ace of said emission active layer respectively, wherein said emission active layer is embedded with a material whose refractive index is lower than that of said emission active later itself and said emission active layer has a stripe structure extended in the longitudinal direction of said resonator structure, so that said laser light propagated in said emission active layer is stabilized in the fundamental traverse-mode.

19. A semiconductor laser device according to claim 18, further comprising a semiconductor crystal formed at both sides of said stripe structure so as to embed said stripe structure, said semiconductor crystal having a larger bandgap energy than the bandgap energy of said emission active layer or the energy of the laser light from said emission active layer corresponding to the oscillation wavelength.

20. A semiconductor laser device according to claim 19, wherein said semiconductor crystal embedding both sides of said stripe structure is set so as to modulate the width of one side of said stripe structure periodically or the widths of both sides thereof non-periodically, thereby said optical waveguide is formed so that the optical loss and said refractive index difference both in said optical waveguide along said resonator structure in said emission active layer are not changed linearly nor in uniform.

21. A semiconductor laser device according to claim 18, wherein said stripe structure has an optical waveguide structure, in which the width thereof is modulated and the number of narrowed areas thereof is set according to the number of beating bellys of said laser light in the fundamental traverse-mode in said resonator structure.

22. An optical information processing system, comprising:

a light source having a resonator structure for generating a laser light formed on a substrate;

an information recording medium;

an optical system for applying said laser light on said information recording medium;

a driving power supply for supplying a current to said light source; and a controller for controlling said driving power supply, wherein said light source has a stripe optical waveguide provided in said resonator structure, and said stripe optical waveguide has right and left sides which are different in shape from each other in its cross sectional view cut at a plane vertical to said substrate and parallel to the facets of said resonator structure and at least one of which has concave and convex portions in the longitudinal direction of said stripe optical waveguide in its top view.

23. An optical information processing system according to claim 21, wherein said stripe waveguide is set so as not to couple a fundamental traverse-mode of said laser light with its high order mode.

24. An optical information processing system according to claim 22 or 23, wherein said resonator structure which said light source has is composed of a semiconductor.

25. An optical information processing system according to claim 22 or 23, wherein said stripe optical waveguide is formed so that the distance difference between concave and convex portions provided at one side in the longitudinal direction thereof is set larger than the distance difference between concave and convex portions provided at the other side in the longitudinal direction thereof.

26. An optical information processing system according to claim 22 or 23, wherein one side of said stripe optical waveguide in the longitudinal direction is formed linearly.

27. An optical information processing system according to claim 22, wherein said stripe optical waveguide is formed so as to increase and reduce a width thereof at least twice between the facets of said resonator structure, and the center axis of said stripe optical waveguide in a longitudinal direction is inclined to the facets of said resonator structure at an angle θ within 0°<θ≦0.5° to an imaginary line vertical to the facets of said resonator structure at the shortest distance.

28. An optical information processing system, comprising:
- a light source having a resonator structure for generating a laser light formed on a substrate;
- an information recording medium;
- an optical system for applying said laser light on said information recording medium;
- a driving power supply for supplying a current to said light source; and
- a controller for controlling said driving power supply,
- wherein said light source has a stripe optical waveguide provided in said resonator structure, said stripe optical waveguide is formed so as to increase and reduce its width at least twice between the facets of said resonator structure, and the center axis of said stripe optical waveguide in the longitudinal direction is inclined to the facets of said resonator structure at an angle θ within $0° < θ \leq 0.5°$ to an imaginary line vertical to the facets of said resonator structure at the shortest distance.

29. An optical information processing system according to claim 28, wherein said angle θ is set within a range of $0° < θ \leq 0.40°$.

30. An optical information processing system according to claim 28, wherein said angle θ is set within a range of $0.1° < θ \leq 0.3°$.

31. An optical information processing system according to claim 22, 23, or 26,
- wherein said light source is a semiconductor laser device comprising a substrate consisting of semiconductor crystal, an emission active layer formed on said substrate, two optical waveguide layers provided on the upper and the lower surface of said emission active layer respectively, and a ridge-shaped stripe structure which is formed by processing one of said two optical waveguide layers provided on the upper surface of said emission active layer so as to be extended in the longitudinal direction of said resonator of said light source; and
- wherein the width of said stripe structure is set so as to obtain an effective refractive index difference in the direction in which said emission active layer crosses the longitudinal direction of said resonator structure so that propagation of said laser light propagated in said emission active layer is stabilized in the fundamental traverse-mode.

32. An optical information processing system according to claim 31, further comprising a semiconductor crystal formed at both sides of said ridge-shaped stripe structure so as to embed said stripe structure, said semiconductor crystal having a larger bandgap energy than the bandgap energy of said emission active layer or the energy of the laser light from said emission active layer corresponding to the oscillation wavelength.

33. A semiconductor laser device according to claim 30, wherein said semiconductor crystal embedding both sides of said ridge-shaped stripe structure is set so as to modulate the width of one side of said ridge-shaped stripe structure periodically or the widths of both sides thereof non-periodically, thereby said optical waveguide is formed so that the optical propagation inner loss and said refractive index difference both of which are along said resonator structure in said emission active layer are not changed linearly nor in uniform.

34. An optical communication system including:
- a light source having a resonator structure for generating a laser light formed on a substrate,
- wherein said light source has a stripe optical waveguide provided in said resonator structure and said stripe optical waveguide has right and left sides which are different in shape from each other in its cross sectional view cut at a plane vertical to said substrate and parallel to the facets of said resonator structure, and at least one of which has concave and convex portions in the longitudinal direction of said stripe optical waveguide in its top view.

35. An optical communication system according to claim 34, wherein said stripe optical waveguide is formed so as to increase and reduce a width thereof at least twice between the facets of said resonator structure, and the center axis of said stripe optical waveguide in a longitudinal direction is inclined to the facets of said resonator structure at an angle θ within $0° < θ \leq 0.5°$ to an imaginary line vertical to the facets of said resonator structure at the shortest distance.

36. An optical communication system including:
- a light source having a resonator structure for generating a laser light,
- wherein said light source has a stripe optical waveguide provided in said resonator structure, said stripe optical waveguide is formed so as to increase and reduce its width at least twice between the facets of said resonator structure, and the center axis of said stripe optical waveguide in the longitudinal direction is inclined to the facets of said resonator structure at an angle θ within $0° < θ \leq 0.5°$ to an imaginary line vertical to the facets of said resonator structure at the shortest distance.

* * * * *